United States Patent
Iwai et al.

(10) Patent No.: US 9,482,955 B2
(45) Date of Patent: Nov. 1, 2016

(54) LITHOGRAPHIC PRINTING PLATE PRECURSOR AND PLATE MAKING METHOD THEREOF

(71) Applicant: FUJIFILM Corporation, Tokyo (JP)

(72) Inventors: Yu Iwai, Shizuoka (JP); Hidekazu Oohashi, Shizuoka (JP); Takanori Mori, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/087,275

(22) Filed: Nov. 22, 2013

(65) Prior Publication Data

US 2014/0080054 A1 Mar. 20, 2014

Related U.S. Application Data

(63) Continuation of application No. PCT/JP2012/060079, filed on Apr. 12, 2012.

(30) Foreign Application Priority Data

May 31, 2011 (JP) .................. 2011-122627

(51) Int. Cl.
| | | |
|---|---|---|
| G03F 7/00 | (2006.01) |
| G03F 7/30 | (2006.01) |
| B41C 1/10 | (2006.01) |
| G03F 7/09 | (2006.01) |
| G03F 7/11 | (2006.01) |

(52) U.S. Cl.
CPC .......... *G03F 7/3042* (2013.01); *B41C 1/1016* (2013.01); *G03F 7/09* (2013.01); *G03F 7/11* (2013.01); *G03F 7/3035* (2013.01); *B41C 2201/02* (2013.01); *B41C 2201/04* (2013.01); *B41C 2201/10* (2013.01); *B41C 2201/14* (2013.01); *B41C 2210/04* (2013.01); *B41C 2210/08* (2013.01); *B41C 2210/22* (2013.01); *B41C 2210/24* (2013.01)

(58) Field of Classification Search
CPC .. B41C 2201/04; B41C 2210/08; G03F 7/11
USPC .................. 430/270.1, 271.1, 281.1, 302
See application file for complete search history.

(56) References Cited

U.S. PATENT DOCUMENTS

| | | |
|---|---|---|
| 2001/0018159 A1 | 8/2001 | Maemoto |
| 2002/0177074 A1 | 11/2002 | Hoshi et al. |
| 2005/0244746 A1 | 11/2005 | Makino et al. |
| 2009/0111049 A1 | 4/2009 | Oya et al. |
| 2009/0311482 A1* | 12/2009 | Tao et al. ............. 428/172 |
| 2010/0248138 A1 | 9/2010 | Mori |

FOREIGN PATENT DOCUMENTS

| | | | |
|---|---|---|---|
| EP | 1231074 A2 * | 8/2002 | ............. B41N 3/03 |
| EP | 2383612 A1 * | 11/2011 | |
| JP | 2001277740 A | 10/2001 | |
| JP | 2001277742 A | 10/2001 | |
| JP | 2002287334 A | 10/2002 | |
| JP | 2005186505 A | 7/2005 | |
| JP | 2005313491 A | 11/2005 | |
| JP | 2006102947 A | 4/2006 | |
| JP | 2006239867 A | 9/2006 | |
| JP | 2009154525 A | 7/2009 | |
| JP | 2010228356 A | 10/2010 | |
| WO | 2006028440 A1 | 3/2006 | |

OTHER PUBLICATIONS

International Search Report, dated May 22, 2012, issued by the International Searching Authority in counterpart International Application No. PCT/JP2012/060079.
Written Opinion, dated May 22, 2012, issued by the International Searching Authority in counterpart International Application No. PCT/JP2012/060079.
Extended European Search Report dated Jun. 25, 2015, issued by the European Patent Office in counterpart European Application No. 12793788.6.

* cited by examiner

*Primary Examiner* — Chanceity Robinson
(74) *Attorney, Agent, or Firm* — Sughrue Mion, PLLC

(57) ABSTRACT

A lithographic printing plate precursor which is excellent in both the on-press development property and the printing durability and which is excellent particularly in the on-press development property after preservation for a long period of time, wherein the lithographic printing plate precursor includes an intermediate layer containing a polymer compound including a repeating unit (a1) having a support-adsorbing group and a repeating unit (a2) having a polyoxyalkylene group having a repeating number of oxyalkylene units from 8 to 120 between a support and a polymerizable image-recording layer, and contains a compound having a molecular weight of 1,500 or less and having an oxyalkylene group in at least any of the intermediate layer and the polymerizable image-recording layer.

13 Claims, No Drawings

LITHOGRAPHIC PRINTING PLATE PRECURSOR AND PLATE MAKING METHOD THEREOF

CROSS REFERENCE TO RELATED APPLICATION

This is a continuation of International Application No. PCT/JP2012/060079 filed on Apr. 12, 2012, and claims priority from Japanese Patent Application No. 2011-122627 filed on May 31, 2011, the entire disclosure of which is incorporated herein by reference.

TECHNICAL FIELD

The present invention relates to a lithographic printing plate precursor and a plate making method thereof. More particularly, it relates to a negative-working lithographic printing plate precursor which is capable of undergoing a direct plate making by image exposure with laser and is undergoing on-press development, and a plate making method thereof.

BACKGROUND ART

In general, a lithographic printing plate is composed of an oleophilic image area accepting ink and a hydrophilic non-image area accepting dampening water in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) is heretofore used. Specifically, the PS plate is exposed through a mask, for example, a lith film, and then subjected to development processing, for example, with an alkaline developer to remove the unnecessary image-recording layer corresponding to the non-image area by dissolving while leaving the image-recording layer corresponding to the image area, thereby obtaining the lithographic printing plate.

Due to the recent progress in the technical field, nowadays the lithographic printing plate can be obtained by a CTP (computer-to-plate) technology. Specifically, a lithographic printing plate precursor is directly subjected to scanning exposure using laser or laser diode without using a lith film and developed to obtain a lithographic printing plate.

With the progress described above, the issue on the lithographic printing plate precursor has transferred to improvements, for example, in image-forming property corresponding to the CTP technology, printing property or physical property. Also, with the increasing concern about global environment, as another issue on the lithographic printing plate precursor, an environmental problem on waste liquid discharged accompanying the wet treatment, for example, development processing comes to the front.

In response to the environmental problem, simplification of development or plate making or non-processing has been pursued. As one method of simple plate making, a method referred to as an "on-press development" is practiced. Specifically, according to the method after exposure of a lithographic printing plate precursor, the lithographic printing plate precursor is mounted as it is on a printing machine without conducting conventional development and removal of the unnecessary area of image-recording layer is performed at an early stage of printing process.

In the plate making operation as described above, a system using a lithographic printing plate precursor capable of being handled in a bright room or under a yellow lamp and a light source is preferred from the standpoint of workability. Thus, as the light source, a semiconductor laser emitting an infrared ray having a wavelength of 760 to 1,200 or a solid laser, for example, YAG laser, is used.

As the lithographic printing plate precursor capable of undergoing on-press development, for instance, a lithographic printing plate precursor having provided on a hydrophilic support, an image-recording layer (heat-sensitive layer) containing microcapsules having a polymerizable compound encapsulated therein is described in Patent Document 1 or 2. A lithographic printing plate precursor having provided on a support, an image-recording layer (photosensitive layer) containing an infrared absorbing agent, a radical polymerization initiator and a polymerizable compound is described in Patent Document 3.

In the lithographic printing plate precursor of the on-press development type, it is extremely difficult to achieve a good balance between on-press development property and printing durability and therefore, a further improvement has been desired.

In order to achieve the good balance between on-press development property and printing durability, it is known to provide an intermediate layer containing a polymer compound including a repeating unit (A) having a support-adsorbing group and a repeating unit (B) having an alkylene oxy unit (see Patent Document 4). However, the on-press development property does not yet reach a sufficient level according to the technique.

It is also known that the water permeability of layer surface increases to improve the on-press development property by adding a specific compound having a polyoxyethylene group or polyoxypropylene group to an intermediate layer provided between a support and an image-recording layer or the image-recording layer (see Patent Document 5). However, it is found that in case of preserving the lithographic printing plate precursor, particularly when the lithographic printing plate precursor has an overcoat layer or when the lithographic printing plate precursors are preserved with an interleaf inserted therebetween, the specific compound migrates into the overcoat layer or interleaf to decrease the amount of specific compound in the intermediate layer or the image-recording layer, thereby severely deteriorating the on-press development property after the preservation.

PRIOR ART DOCUMENT

Patent Document

Patent Document 1: JP-A-2001-277740
Patent Document 2: JP-A-2001-277742
Patent Document 3: JP-A-2002-287334
Patent Document 4: WO 2006/028440
Patent Document 5: JP-A-2009-154525

DISCLOSURE OF THE INVENTION

Problems that the Invention is to Solve

An object of the present invention is to provide a lithographic printing plate precursor which is excellent in both the on-press development property and the printing durability and which is excellent particularly in the on-press development property after preservation for a long period of time, and a plate making method thereof.

Means for Solving the Problems

As a result of the intensive investigations, the inventors have found that the on-press development property, in particular, the on-press development property after preservation for a long period of time can be considerably improved by incorporating a low molecular weight compound having an oxyalkylene group into an intermediate layer or a polymerizable image-recording layer and providing an intermediate layer containing a polymer compound including a repeating unit (A) having a support-adsorbing group and a repeating unit (B) having a polyoxyalkylene group having a repeating number of oxyalkylene units from 8 to 120 between the support and the polymerizable image-recording layer to complete the invention. The invention includes the following items.

(1) A lithographic printing plate precursor comprising a polymerizable image-recording layer on a support, wherein the lithographic printing plate precursor comprises an intermediate layer containing a polymer compound including a repeating unit (a1) having a support-adsorbing group and a repeating unit (a2) having a polyoxyalkylene group having a repeating number of oxyalkylene units from 8 to 120 between the support and the polymerizable image-recording layer, and contains a compound having a molecular weight of 1,500 or less and having an oxyalkylene group in at least any of the intermediate layer and the polymerizable image-recording layer.

(2) The lithographic printing plate precursor as described in (1) above, wherein the oxyalkylene group of the compound having a molecular weight of 1,500 or less and having an oxyalkylene group is a polyoxyethylene group or a polyoxypropylene group.

(3) The lithographic printing plate precursor as described in (2) above, wherein the compound having a molecular weight of 1,500 or less and having a polyoxyethylene group or a polyoxypropylene group has an acid group or a salt thereof.

(4) The lithographic printing plate precursor as described in (3) above, wherein the compound having a molecular weight of 1,500 or less and having a polyoxyethylene group or a polyoxypropylene group and an acid group or a salt thereof is a compound represented by formula (1A) shown below or a compound having a structure represented by formula (1B) shown below:

R—Z—Y—X          (1A)

In formula (1A), R represents a substituted or unsubstituted, alkyl group, alkenyl group, alkynyl group, aryl group or heterocyclic group, Z represents a polyoxyethylene group or a polyoxypropylene group, Y represents a substituted or unsubstituted alkylene group having 18 or less carbon atoms, a substituted or unsubstituted arylene group having 30 or less carbon atoms or a divalent heterocyclic group, and X represents an acid group or a salt thereof

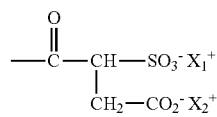

(1B)

In formula (1B), $X_1^+$ and $X_2^+$, which may be the same or different, each represents $H^+$ or a monovalent cationic group, or one divalent cationic group may be present in place of $X_1^+$ and $X_2^+$.

(5) The lithographic printing plate precursor as described in (3) or (4) above, wherein the acid group or a salt thereof is a sulfonic acid group or a salt thereof.

(6) The lithographic printing plate precursor as described in any one of (2) to (5) above, wherein an oxyethylene or oxypropylene repeating unit number n of the polyoxyethylene group or polyoxypropylene group in the compound having a molecular weight of 1,500 or less and having a polyoxyethylene group or a polyoxypropylene group is from 2 to 20.

(7) The lithographic printing plate precursor as described in (6) above, wherein an oxyethylene or oxypropylene repeating unit number n of the polyoxyethylene group or polyoxypropylene group in the compound having a molecular weight of 1,500 or less and having a polyoxyethylene group or a polyoxypropylene group is from 2 to 15.

(8) The lithographic printing plate precursor as described in any one of (2) to (7) above, wherein the oxyalkylene group of the compound having a molecular weight of 1,500 or less and having an oxyalkylene group is a polyoxyethylene group.

(9) The lithographic printing plate precursor as described in any one of (1) to (8) above, wherein the polyoxyalkylene group of the polymer compound including a repeating unit (a1) having a support-adsorbing group and a repeating unit (a2) having a polyoxyalkylene group is a polyoxyethylene group or a polyoxypropylene group and a repeating unit number n is from 15 to 100.

(10) The lithographic printing plate precursor as described in any one of (1) to (9) above, wherein the polymer compound including a repeating unit (a1) having a support-adsorbing group and a repeating unit (a2) having a polyoxyalkylene group having a repeating number of oxyalkylene units from 8 to 120 includes a repeating unit (a3) having an ethylenically unsaturated bond in its side chain.

(11) The lithographic printing plate precursor as described in any one of (1) to (10) above, wherein an overcoat layer is provided on the polymerizable image-recording layer.

(12) The lithographic printing plate precursor as described in any one of (1) to (11) above, wherein the polymerizable image-recording layer is capable of being removed with at least any of ink and dampening water.

(13) A plate making method of a lithographic printing plate precursor comprising exposing imagewise the lithographic printing plate precursor as described in (12) above, mounting the exposed lithographic printing plate precursor on a printing machine and removing an unexposed area of the polymerizable image-recording layer with at least any of printing ink and dampening water.

According to the invention, the problem described above can be solved by incorporating a low molecular weight compound having an oxyalkylene group into an intermediate layer or a polymerizable image-recording layer and providing an intermediate layer containing a polymer compound including a repeating unit (A) having a support-adsorbing group and a repeating unit (B) having a polyoxyalkylene group having a repeating number of oxyalkylene units from 8 to 120 between the support and the polymerizable image-recording layer.

The functional mechanism thereof is not always clear, but it is supposed as follows. A polyoxyalkylene chain of the polymer compound including a repeating unit (A) having a support-adsorbing group and a repeating unit (B) having a polyalkyleneoxy chain existing in the intermediate layer is oriented on the side of polymerizable image-recording layer. The compound having an oxyalkylene group in the intermediate layer and/or polymerizable image-recording layer interacts with the polyoxyalkylene chain oriented so that migration of the compound from the intermediate layer or the image-recording layer in the vicinity of the intermediate layer can be prevented. As a result, even when the lithographic printing plate precursor is preserved for a long period of time in the state of packing, particularly in the case where an overcoat layer or interleaf is present, the migration of the compound to the overcoat layer or interleaf is inhibited, thereby suppressing the deterioration of on-press development property.

Advantage of the Invention

According to the invention, a lithographic printing plate precursor which is excellent in both the on-press development property and the printing durability and which is excellent particularly in the on-press development property after preservation for a long period of time, and a plate making method thereof can be provided.

MODE FOR CARRYING OUT THE INVENTION

The elements and components for use in the lithographic printing plate precursor according to the invention are described in detail below.

[Polymer Compound Including Repeating Unit (a1) Having Support-Adsorbing Group and Repeating Unit (a2) Having Polyoxyalkylene Group Having Repeating Number of Oxyalkylene Units from 8 to 120 (Hereinafter, Referred to as "Specific Polymer Compound")]

<Repeating Unit (a1) Having Support-Adsorbing Group>

The specific polymer compound according to the invention includes a repeating unit (a1) having a support-adsorbing group in order to enhance the adhesion property to the support. The repeating unit (a1) having a support-adsorbing group is preferably a repeating unit having at least any of structures capable of interacting with a surface of support represented by formulae (a1-1), (a1-2), (a1-3), (a1-4) and (a1-5) shown below in its side chain.

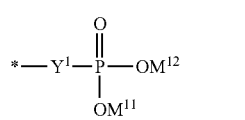

(a1-1)

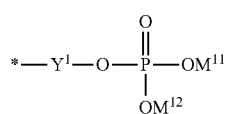

(a1-2)

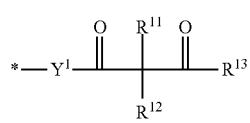

(a1-3)

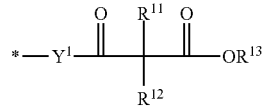

(a1-4)

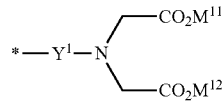

(a1-5)

In formulae (a1-1), (a1-2), (a1-3), (a1-4) and (a1-5), $M^{11}$ and $M^{12}$ each independently represents a hydrogen atom, a metal atom belonging to alkali metal or alkaline earth metal or an ammonium group, $R^{11}$ to $R^{13}$ each independently represents a hydrogen atom or an alkyl group, $Y^1$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

Examples of the alkyl group represented by any one of $R^{11}$ to $R^{13}$ include a methyl group, an ethyl group, a propyl group, an octyl group, an isopropyl group, a tert-butyl group, an isopentyl group, a 2-ethylhexyl group, a 2-methylhexyl group and a cyclopentyl group.

Specific examples of the combination of groups represented by $Y^1$ are set forth below. In each of the specific examples shown below, the left side connects to the main chain. L1: —CO—O-divalent aliphatic group- L2: —CO—O-divalent aromatic group-
L3: —CO—NH-divalent aliphatic group-
L4: —CO—NH-divalent aromatic group-
L5: —CO-divalent aliphatic group-
L6: —CO-divalent aromatic group-
L7: —CO-divalent aliphatic group-CO—O-divalent aliphatic group-
L8: —CO-divalent aliphatic group-O—CO-divalent aliphatic group-
L9: —CO-divalent aromatic group-CO—O-divalent aliphatic group-
L10: —CO-divalent aromatic group-O—CO-divalent aliphatic group-
L11: —CO-divalent aliphatic group-CO—O-divalent aromatic group-
L12: —CO-divalent aliphatic group-O—CO-divalent aromatic group-
L13: —CO-divalent aromatic group-CO—O-divalent aromatic group-
L14: —CO-divalent aromatic group-O—CO-divalent aromatic group-
L15: —CO—O-divalent aromatic group-O—CO—NH-divalent aliphatic group-
L16: —CO—O-divalent aliphatic group-O—CO—NH-divalent aliphatic group- The divalent aliphatic group includes an alkylene group, a substituted alkylene group, an alkenylene group, a substituted alkenylene group, an alkinylene group, a substituted alkinylene group and a polyalkyleneoxy group. Among them, an alkylene group, a substituted alkylene group, an alkenylene group, a substituted alkenylene group and a polyalkyleneoxy group are preferred, and an alkylene group, a substituted alkylene group and a polyalkyleneoxy group are more preferred.

Of the divalent aliphatic groups, a chain structure is preferred than a cyclic structure, and further a straight-chain structure is more preferred than a chain structure having a branch. A number of carbon atoms included in the divalent aliphatic group is preferably from 1 to 20, more preferably from 1 to 15, still more preferably from 1 to 12, yet still more preferably from 1 to 10, and most preferably from 1 to 8.

Examples of the substituent for the divalent aliphatic group include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, an arylamino group and a diarylamino group.

The divalent aromatic group includes an arylene group which may have a substituent. Specifically, a substituted or unsubstituted, phenylene group, naphthylene group and anthrylene group are exemplified. Among them, a phenylene group is preferred.

Examples of the substituent for the divalent aromatic group include an alkyl group in addition to the substituents described for the divalent aliphatic group above.

$Y^1$ is preferably a single bond, —CO—, a divalent aliphatic group, a divalent aromatic group or any one of L1 to L4 described above. From the standpoint of on-press development property, $Y^1$ is more preferably a single bond or L1 described above.

From the standpoint of on-press development and printing durability, the structure capable of interacting with the surface of support is preferably the structure represented by formula (a1-1), (a1-2) or (a1-5), more preferably the structure represented by formula (a1-1) or (a1-2), and most preferably the structure represented by formula (a1-2). In formula (a1-1) or (a1-2), both $M^{11}$ and $M^{12}$ are preferably hydrogen atoms.

Specifically, structures shown below are exemplified.

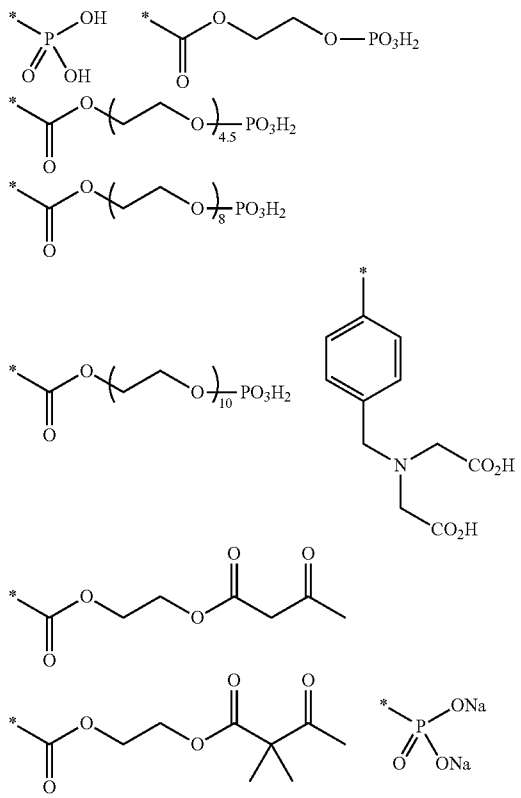

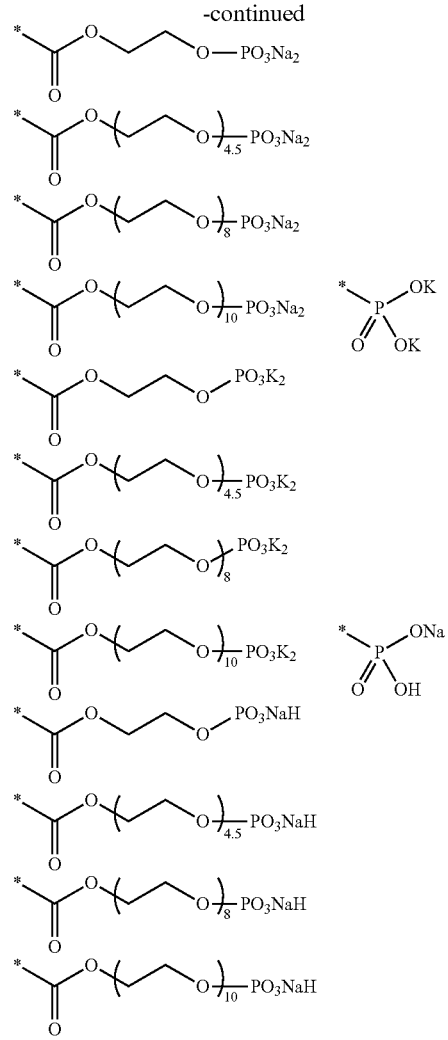

The repeating unit (a1) having at least one structure capable of interacting with the surface of support is preferably a repeating unit represented by formula (A1) shown below.

In formula (A1), $R^{101}$ to $R^{103}$ each independently represents a hydrogen atom, an alkyl group having from 1 to 6 carbon atoms or a halogen atom, and Q represents the structure capable of interacting with the surface of support selected from the structure represented by formulae (a1-1) to (a1-5) described above. The preferred embodiments are also same as the preferred embodiments described in formula (a1-1) to (a1-5) above.

The ratio of the repeating unit (a1) having a functional group capable of interacting with the surface of support in the specific polymer compound according to the invention is preferably in a range from 5 to 95% by weight, more preferably in a range from 5 to 90% by weight, from the standpoint of on-press development property and printing durability.

<Repeating Unit (a2) Having Polyoxyalkylene Group Having Repeating Number of Oxyalkylene Units from 8 to 120>

The specific polymer compound according to the invention further includes a repeating unit (a2) having a polyoxyalkylene structure having a repeating number of oxyalkylene units from 8 to 120 in its side chain. The polyoxyalkylene structure is preferably a structure represented by formula (a2-1) shown below.

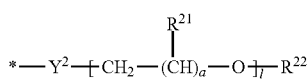

(a2-1)

In formula (a2-1), $R^{21}$ represents a hydrogen atom or an alkyl group, $R^{22}$ represents a hydrogen atom, an alkyl group or an aryl group, a represents an integer from 1 to 5, l represents an integer from 8 to 120, $Y^2$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

In formula (a2-1), examples of the alkyl group represented by $R^{21}$ or $R^{22}$ include a methyl group, an ethyl group, a propyl group, an octyl group, an isopropyl group, a tert-butyl group, an isopentyl group, a 2-ethylhexyl group, a 2-methylhexyl group and a cyclopentyl group. Examples of the aryl group include a phenyl group, a 1-naphtyl group and a 2-naphthyl group.

$R^{21}$ is most preferably a hydrogen atom. $R^{22}$ is preferably a hydrogen atom or a methyl group, and more preferably a methyl group. a is preferably 1 or 2, and most preferably 1, from the standpoint of on-press development property.

l is preferably from 15 to 120, and more preferably from 15 to 100, from the standpoint of on-press development property.

$Y^2$ represents a single bond or a divalent connecting group selected from the group consisting of —CO—, —O—, —HN—, a divalent aliphatic group, a divalent aromatic group and a combination of these groups. The divalent aliphatic group and divalent aromatic group are same as those described for $Y^1$ above. $Y^2$ is most preferably a connecting group represented by L17 shown below.

L17: —CO—O—

In L17, the left side connects to the main chain.

A preferred combination of a, $Y^2$, $R^{21}$ and $R^{22}$ is a combination where a is 1, $Y^2$ is L17, $R^{21}$ is a hydrogen atom or a methyl group, and $R^{22}$ is a hydrogen atom or a methyl group. A unit wherein $R^{21}$ is a hydrogen atom (that is, oxyethylene) and a unit wherein $R^{22}$ is a methyl group (that is, oxypropylene) may coexist. A more preferred combination thereof is a combination where a is 1, $Y^2$ is L17, $R^{21}$ is a hydrogen atom, and $R^{22}$ is a hydrogen atom or a methyl group.

The polyoxyalkylene structure includes specific examples shown below.

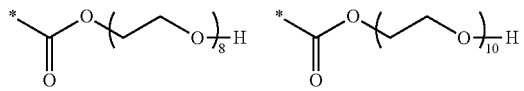

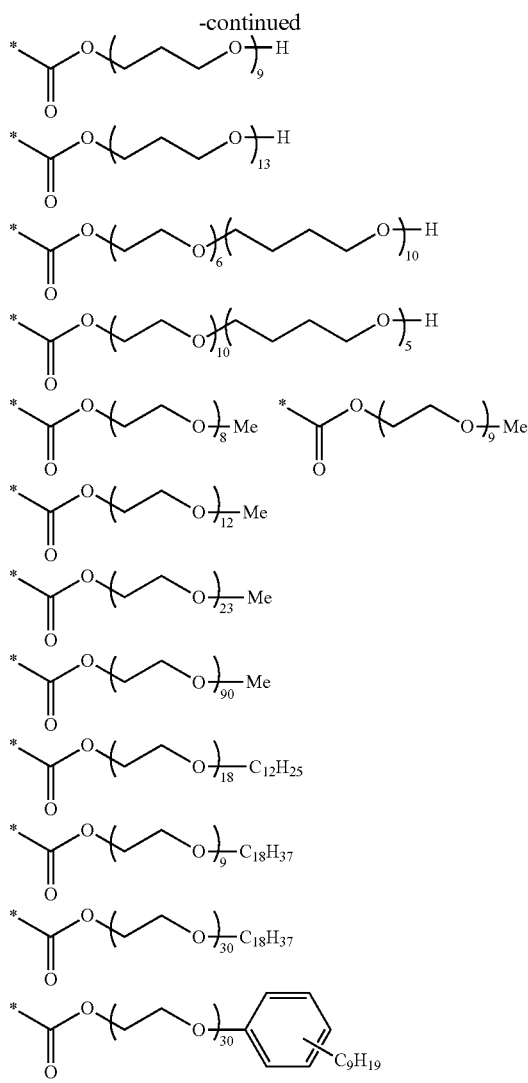

In the invention, specifically, the repeating unit (a2) having a polyoxyalkylene structure is preferably represented by formula (A2) shown below.

(A2)

In the formula above, $R^{201}$ to $R^{203}$ each independently represents a hydrogen atom, an alkyl group having from 1 to 6 carbon atoms or a halogen atom, and J represents a polyoxyalkylene structure represented by formula (a2-1) described above. The preferred embodiments are also same as the preferred embodiments described in formula (a2-1) above.

The ratio of the repeating unit (a2) having a polyoxyalkylene structure in the specific polymer compound according to the invention is preferably in a range from 5 to 95% by weight, more preferably in a range from 20 to 80% by weight, most preferably in a range from 20 to 49% by weight, from the standpoint of on-press development property.

<Repeating Unit (a3) Having Ethylenically Unsaturated Bond in its Side Chain>

The specific polymer compound according to the invention preferably includes a repeating unit (a3) having an ethylenically unsaturated bond in its side chain, from the standpoint of printing durability. Preferred examples of the ethylenically unsaturated bond include an addition polymerizable unsaturated bond group (for example, a (meth)acryloyl group, a (meth)acrylamido group, an allyl group, a vinyl group, a vinyloxy group or an alkynyl group). Among them, to have a methacryl group is most preferred, from the standpoint of printing durability. The term "(meth)acryl group" as used herein means an acyl group and a methacryl group.

The ethylenically unsaturated bond can be introduced by (a) a urethanization reaction using a hydroxy group of the polymer side chain and an isocyanate having the ethylenically unsaturated bond, (b) an esterification reaction using a hydroxy group of the polymer side chain and a carboxylic acid, carboxylic halide, sulfonic halide or carboxylic anhydride having the ethylenically unsaturated bond, (c) a reaction using a carboxyl group or salt thereof of the polymer side chain and an isocyanate having the ethylenically unsaturated bond, (d) an esterification reaction using a halogenated carbonyl group, carboxyl group or salt thereof of the polymer side chain and an alcohol having the ethylenically unsaturated bond, (e) an amidation reaction using a halogenated carbonyl group, carboxyl group or salt thereof of the polymer side chain and an amine having the ethylenically unsaturated bond, (f) an amidation reaction using an amino group of the polymer side chain and a carboxylic acid, carboxylic halide, sulfonic halide or carboxylic anhydride having the ethylenically unsaturated bond, (g) a ring opening reaction between an epoxy group of the polymer side chain and various nucleophilic compounds having the ethylenically unsaturated bond, or (h) an etherification reaction between a haloalkyl group of the polymer side chain and an alcohol having the ethylenically unsaturated bond.

The side chain having an ethylenically unsaturated bond is preferably a structure represented by formula (a3-1) shown below.

(a3-1)

In formula (a3-1), $R^{31}$ to $R^{33}$ each independently represents a hydrogen atom, an alkyl group or an aryl group. Examples of the alkyl group include a methyl group, an ethyl group, a propyl group, an octyl group, an isopropyl group, a tert-butyl group, an isopentyl group, a 2-ethylhexyl group, a 2-methylhexyl group and a cyclopentyl group. Examples of the aryl group include a phenyl group, a 1-naphtyl group and a 2-naphthyl group. $R^{31}$ to $R^{33}$ each independently represents preferably a hydrogen atom or a methyl group.

In formula (a3-1), $Y^3$ represents a single bond or a divalent connecting group selected from the group consisting of —CO—, —O—, —NH—, a divalent aliphatic group, a divalent aromatic group and a combination thereof. Specific examples of the combination of groups represented by $Y^3$ are set forth below. In each of the specific examples shown below, the left side connects to the main chain and the right side connects to the ethylenically unsaturated bond.

L18: —CO—NH-divalent aliphatic group-O—CO—NH-divalent aliphatic group-O—CO—
L19: —CO—NH-divalent aliphatic group-O—CO—
L20: —CO-divalent aliphatic group-O—CO—
L23: —CO—O-divalent aliphatic group-O—CO—
L24: -divalent aliphatic group-O—CO—
L25: —CO—NH-divalent aromatic group-O—CO—
L26: —CO-divalent aromatic group-O—CO—
L27: -divalent aromatic group-O—CO—
L28: —CO—O-divalent aliphatic group-CO—O-divalent aliphatic group-O—CO—
L29: —CO—O-divalent aliphatic group-O—CO-divalent aliphatic group-O—CO—
L30: —CO—O-divalent aromatic group-CO—O-divalent aliphatic group-O—CO—
L31: —CO—O-divalent aromatic group-O—CO-divalent aliphatic group-O—CO—
L32: —CO—O-divalent aliphatic group-CO—O-divalent aromatic group-O—CO—
L33: —CO—O-divalent aliphatic group-O—CO-divalent aromatic group-O—CO—
L34: —CO—O-divalent aromatic group-CO—O-divalent aromatic group-O—CO—
L35: —CO—O-divalent aromatic group-O—CO-divalent aromatic group-O—CO—
L36: —CO—O-divalent aromatic group-O—CO—NH-divalent aliphatic group-O—CO—
L37: —CO—O-divalent aliphatic group-O—CO—NH-divalent aliphatic group-O—CO—
L38: —CO—NH-divalent aliphatic group-NH—CO—NH-divalent aliphatic group-O—CO—
L39: —CO—NH-divalent aromatic group-NH—CO—NH-divalent aliphatic group-O—CO—
L40: —CO—O-divalent aliphatic group-NH—CO—NH-divalent aliphatic group-O—CO—
L41: —CO—O-divalent aromatic group-NH—CO—NH-divalent aliphatic group-O—CO—

The divalent aliphatic group and divalent aromatic group have the same meanings as described above.

$Y^3$ is preferably L18, L23, L37, L38 or L39.

The structure represented by formula (a3-1) specifically includes structures shown below.

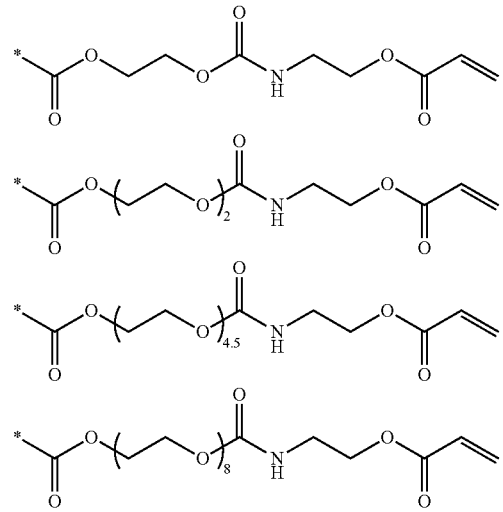

The repeating unit (a3) having an ethylenically unsubstituted bond in its side chain is preferably a repeating unit represented by formula (A3) shown below.

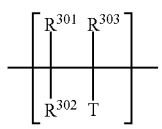

(A3)

In formula (A3), $R^{301}$ to $R^{303}$ each independently represents a hydrogen atom, an alkyl group having from 1 to 6 carbon atoms or a halogen atom, and T represents a structure of a side chain having an ethylenically unsubstituted bond represented by formula (a3-1) described above.

In the specific polymer compound, the ratio of the repeating unit (a3) having an ethylenically unsubstituted bond in its side chain is preferably from 1 to 50% by weight, more preferably from 1 to 30% by weight, and most preferably from 1 to 20% by weight.

[Other Repeating Unit (D)]

The specific polymer compound according to the invention may be a copolymer including a repeating unit other than the repeating units described above. A monomer capable of using copolymerization of the specific polymer compound includes a monomer selected, for example, from an acrylic acid ester, a methacrylic acid ester, an N,N-disubstituted acrylamide, an N,N-disubstituted methacrylamide, a styrene, an acrylonitrile and a methacrylonitrile.

Specifically, for instance, an alkyl acrylate (preferably having from 1 to 20 carbon atoms in the alkyl group thereof, for example, methyl acrylate, ethyl acrylate, propyl acrylate, butyl acrylate, amyl acrylate, ethylhexyl acrylate, octyl acrylate, tert-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate or tetrahydrofurfuryl acrylate), an aryl acrylate (for example, phenyl acrylate), an alkyl methacrylate (preferably having from 1 to 20 carbon atoms in the alkyl group thereof, for example, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate or tetrahydrofurfuryl methacrylate), an aryl methacrylate (for example, phenyl methacrylate, cresyl methacrylate or naphthyl methacrylate), styrene, styrene such as an alkylstyrene (for example, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene or acetoxymethylstyrene), an alkoxystyrene (for example, methoxystyrene, 4-methoxy-3-methylstyrene or dimethoxystyrene), or a halogen-containing styrene (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene or 4-fluoro-3-trifluoromethylstyrene), acrylonitrile, methacrylonitrile, methacrylic acid, acrylic acid and 2-acrylamido-2-methylpropanesulfonic acid are exemplified.

The specific polymer compound according to the invention may also include a repeating unit having a side chain having a zwitter ion structure. The side chain having a zwitter ion structure is preferably represented by formula (a4-1) or (a4-2) shown below.

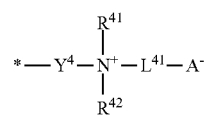

(a4-1)

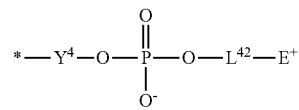

(a4-2)

In formula (a4-1), $R^{41}$ and $R^{42}$ each independently represents a hydrogen atom, an alkyl group, an alkenyl group, an alkynyl group, an aryl group or a heterocyclic group, or $R^{41}$ and $R^{42}$ may be combined with each other to from a ring structure, $L^{41}$ represents a connecting group, $A^-$ represents a structure having an anion, $Y^4$ represents a divalent connecting group connecting to a main chain of the polymer compound, and * indicates a site connecting to a main chain of the polymer compound.

The ring structure formed by combining $R^{41}$ and $R^{42}$ with each other may contain a hetero atom, for example, an oxygen atom and is preferably a 5-membered to 10-membered ring, and more preferably a 5-membered or 6-membered ring.

A number of carbon atoms of each of $R^{41}$ and $R^{42}$ including a number of carbon atoms of a substituent which may be present described hereinafter is preferably from 1 to 30, more preferably from 1 to 20, particularly preferably from 1 to 15, and most preferably from 1 to 8.

Examples of the alkyl group represented by each of $R^{41}$ and $R^{42}$ include a methyl group, an ethyl group, a propyl group, an octyl group, an isopropyl group, a tert-butyl group, an isopentyl group, a 2-ethylhexyl group, a 2-methylhexyl group and a cyclopentyl group.

Examples of the alkenyl group represented by each of $R^{41}$ and $R^{42}$ include a vinyl group, an allyl group, a prenyl group, a geranyl group and an oleyl group.

Examples of the alkynyl group represented by each of $R^{41}$ and $R^{42}$ include an ethynyl group, a propargyl group and a trimethylsilylethynyl group.

Examples of the aryl group represented by each of $R^{41}$ and $R^{42}$ include a phenyl group, a 1-naphtyl group and a 2-naphthyl group. Examples of the heterocyclic group include a furanyl group, a thiophenyl group and a pyridinyl group.

These groups may have a substituent. Examples of the substituent include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

$R^{41}$ and $R^{42}$ each particularly preferably represents a hydrogen atom, a methyl group or an ethyl group from the standpoint of effect and ready availability. A methyl group or an ethyl group is most preferred.

$L^{41}$ represents a connecting group, is preferably a connecting group made from —CO—, —O—, —NH—, a divalent aliphatic group, a divalent aromatic group and a combination thereof, and preferably has 30 or less carbon atoms including a number of carbon atoms of a substituent which may be present described hereinafter. The connecting group is more preferably an alkylene group (having preferably from 1 to 20 carbon atoms, more preferably from 1 to 10 carbon atoms) or an arylene group (having preferably from 5 to 15 carbon atoms, more preferably from 6 to 10 carbon atoms), for example, a phenylene group or a xylylene group. From the standpoint of on-press development, $L^{41}$ is preferably a straight-chain alkylene group having from 3 to 5 carbon atoms, more preferably a straight-chain alkylene group having 4 or 5 carbon atoms, and most preferably a straight-chain alkylene group having 4 carbon atoms.

Specific examples of $L^{41}$ include connecting groups shown below.

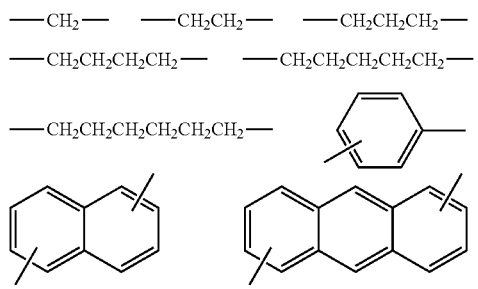

The connecting group may have a substituent.

Examples of the substituent include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

In formula (a4-1), $A^-$ preferably represents a carboxylate, a sulfonate, a phosphonate or a phosphinate.

Specifically, anions shown below are exemplified.

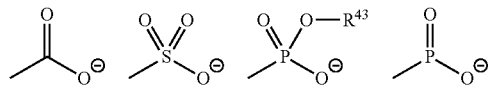

In the formulae above, $R^{43}$ has the same meaning as $R^{41}$ or $R^{42}$ described above.

From the standpoint of on-press development property, $A^-$ is most preferably a sulfonate. Further, in formula (a4-1), a combination where $L^{41}$ is a straight-chain alkylene group having 4 to 5 carbon atoms and $A^-$ is a sulfonate is preferred, and a combination where $L^{41}$ is a straight-chain alkylene group having 4 carbon atoms and $A^-$ is a sulfonate is most preferred.

A combination where $Y^4$ is L1 or L3 described above, $R^{41}$ and $R^{42}$ each represents an ethyl group or a methyl group, $L^{41}$ is a straight-chain alkylene group having 4 to 5 carbon atoms and $A^-$ is a sulfonate is preferred.

Further, a combination where $Y^4$ is L3 described above, $R^{41}$ and $R^{42}$ each represents a methyl group, $L^{41}$ is a straight-chain alkylene group having 4 carbon atoms and $A^-$ is a sulfonate is more preferred.

Specifically, structures shown below are preferred.

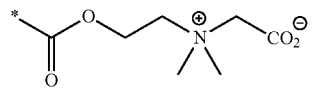

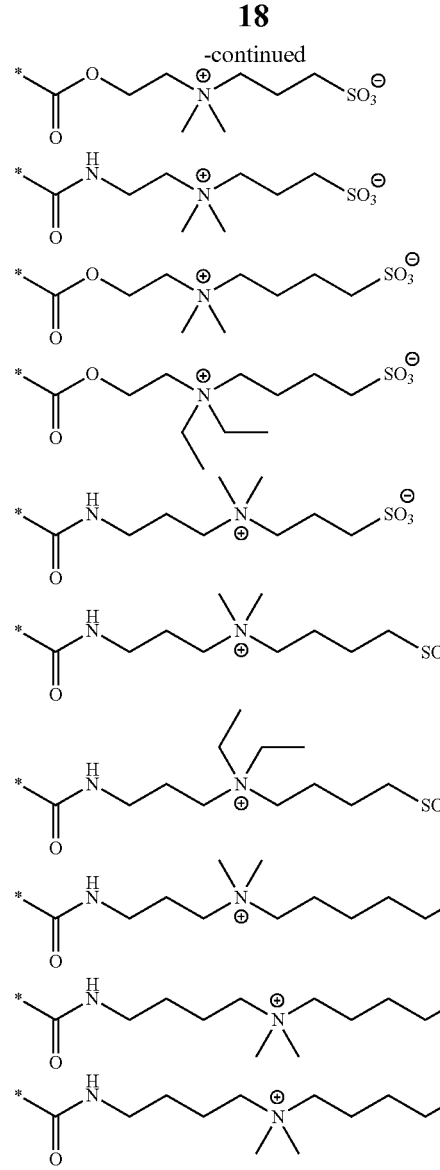

In formula (a4-2), $L^{42}$ represents a connecting group and is preferably selected from the group consisting of —CO—, —O—, —NH—, a divalent aliphatic group, a divalent aromatic group and a combination thereof. Specific examples and preferred examples thereof are same as those described for the connecting group represented by $L^{41}$ above.

$Y^4$ has the same meaning as $Y^4$ in formula (a4-1) and preferred examples thereof are also same as those described for $Y^4$. * indicates a site connecting to a main chain of the polymer compound.

$E^+$ represents a structure having a cation. $E^+$ preferably represents a structure having an ammonium, a phosphonium, an iodonium or a sulfonium, more preferably a structure having an ammonium or a phosphonium, and particularly preferably a structure having an ammonium. Examples of the structure having a cation include a trimethylammonio group, a triethylammonio group, a tributylammonio group, a benzyldimethylammonio group, a diethylhexylammonio group, a (2-hydroxyethyl)dimethylammonio group, a pyridinio group, an N-methylimidazolio group, an N-acridinio group, a trimethylphosphonio group, a triethylphosphonio group and a triphenylphosphonio group.

A most preferred combination of $L^{42}$, $Y^4$ and $E^+$ is a combination where $L^{42}$ is an alkylene group having from 2 to 4 carbon atoms, $Y^4$ is L1 or L3 described above and $E^+$ is a trimethylammonio group or a triethylammonio group.

Specifically, structures shown below are exemplified.

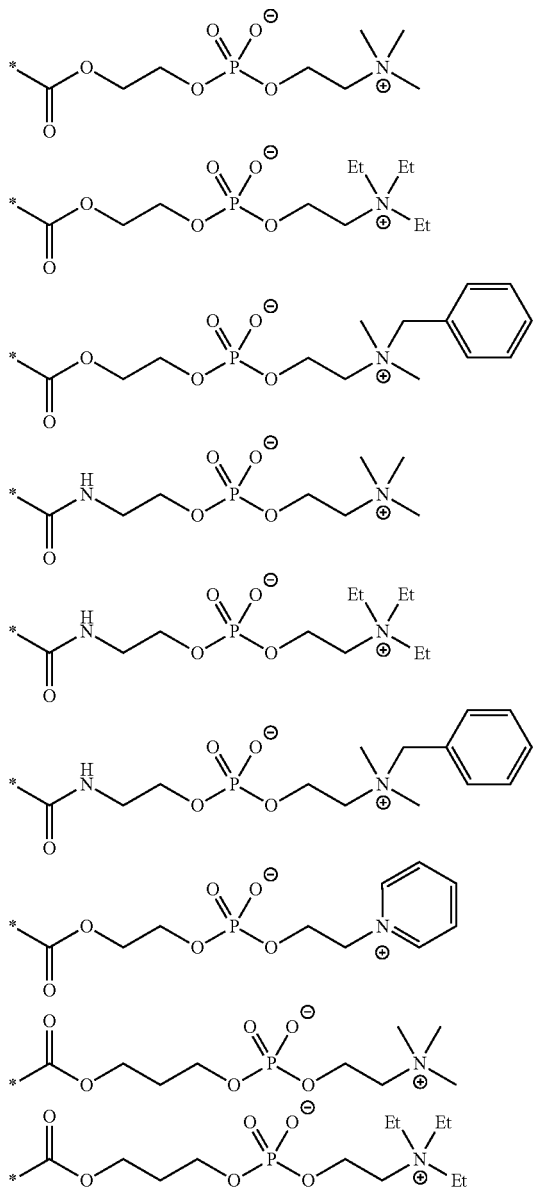

In the invention, specifically, the repeating unit having a zwitter ion structure is preferably represented by formula (A4) shown below.

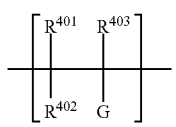

(A4)

In the formula above, $R^{401}$ to $R^{403}$ each independently represents a hydrogen atom, an alkyl group having from 1 to 6 carbon atoms or a halogen atom. G represents a side chain having a zwitter ion structure and is preferably a structure represented by formula (a4-1) or (a4-2) described above. Preferred examples and combinations with respect to formulae (a4-1) and (a4-2) are same as those described above.

Although the specific polymer compound according to the invention is able to be synthesized by any hitherto known method, a radical polymerization method is preferably used for the synthesis thereof. Ordinary radical polymerization methods are described, for example, in *Shin Kobunshi Jikkengaku* 3, edited by The Society of Polymer Science, Japan, published on Mar. 28, 1996 (Kyoritsu Shuppan Co., Ltd.), *Kobunshi no Gosei to Hanno* 1, edited by The Society of Polymer Science, Japan, published in May, 1992 (Kyoritsu Shuppan Co., Ltd.), *Shin Jikken Kagaku Koza* 19, *Kobunshi Kagaku* (*I*), edited by The Chemical Society of Japan, published on Nov. 20, 1980 (Maruzen Co., Ltd.) and *Busshitsu Kogaku Koza, Kobunshi Gosei Kagaku*, published in September, 1995 (Tokyo Denki University Press) and these methods can be applied.

A weight average molecular weight (Mw) of the specific polymer compound according to the invention can be appropriately set according to performance design of the lithographic printing plate precursor. The weight average molecular weight is preferably from 2,000 to 1,000,000, more preferably from 2,000 to 500,000, and most preferably from 10,000 to 500,000 from the standpoint of printing durability and on-press development property.

Specific examples of the specific polymer compound are set forth below together with the weight average molecular weight (Mw) thereof, but the invention should not be construed as being limited thereto. The composition ratio in the polymer compound is expressed in weight percentage.

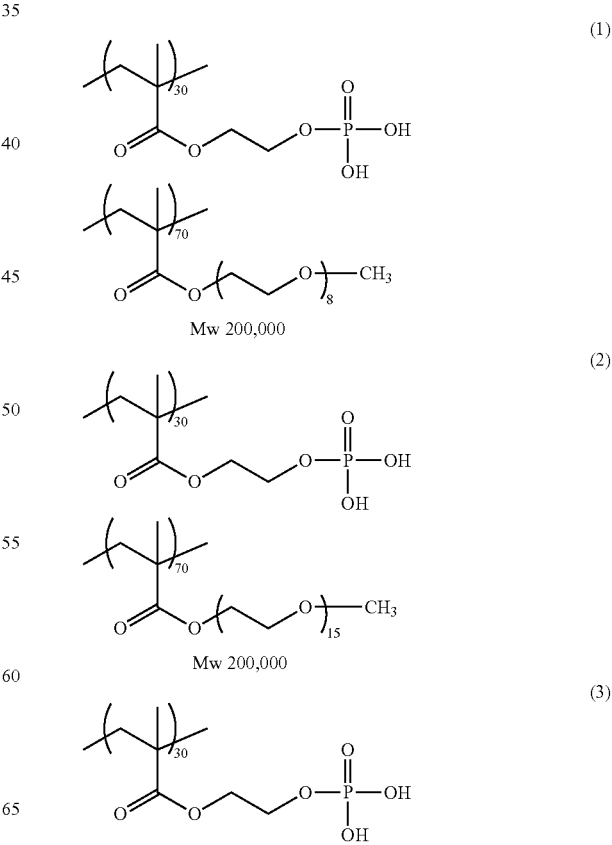

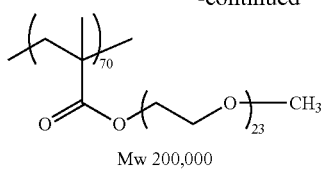
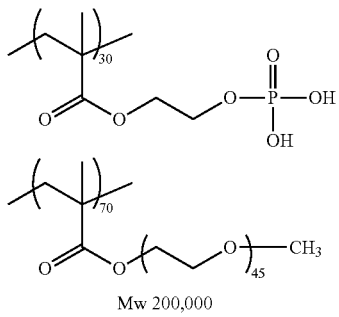
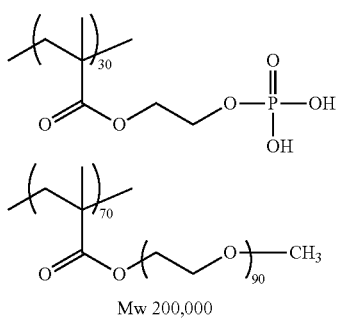
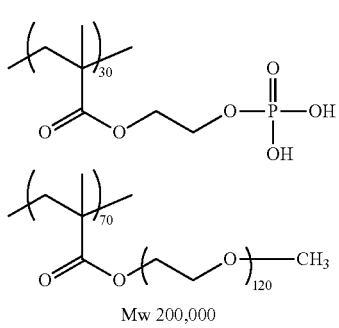
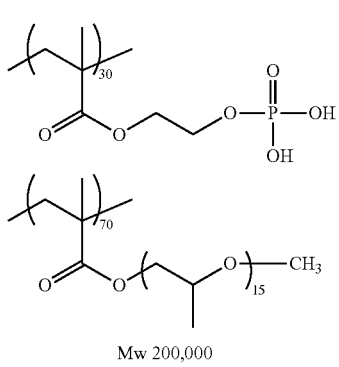
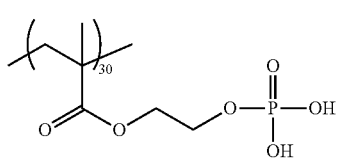
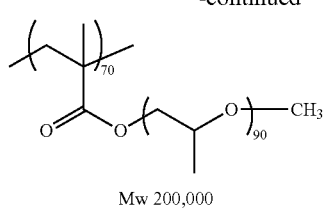
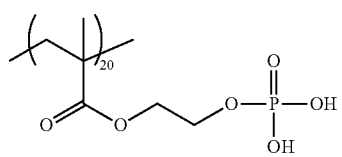
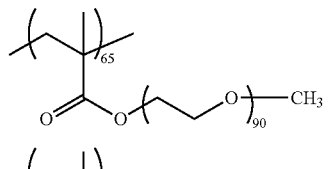
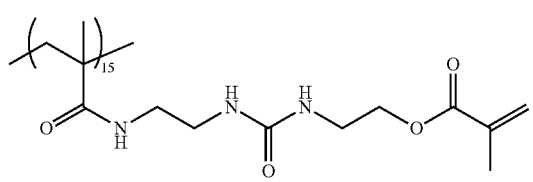
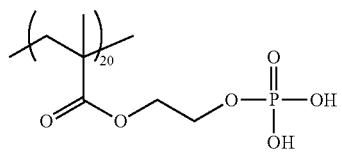
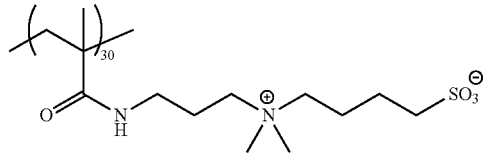
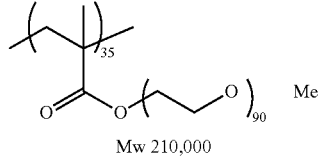
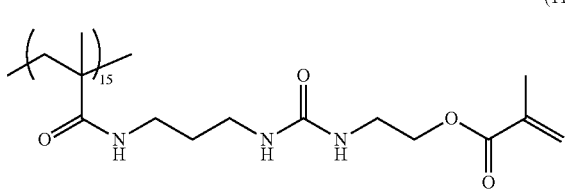

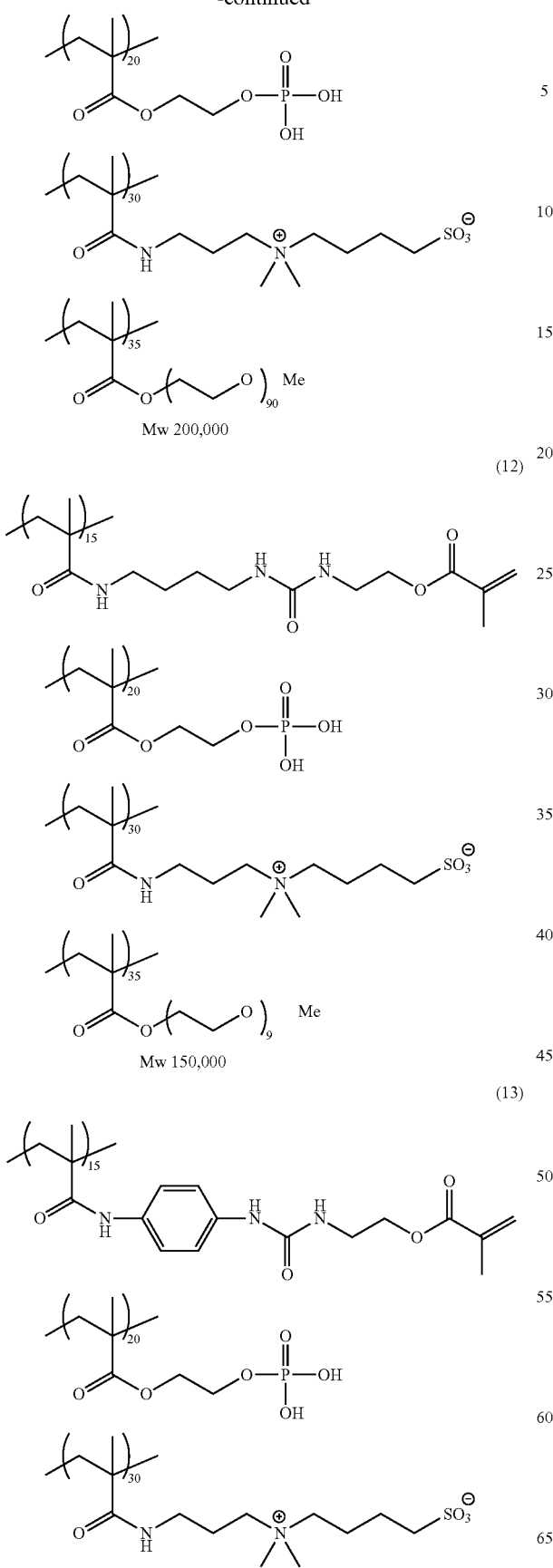
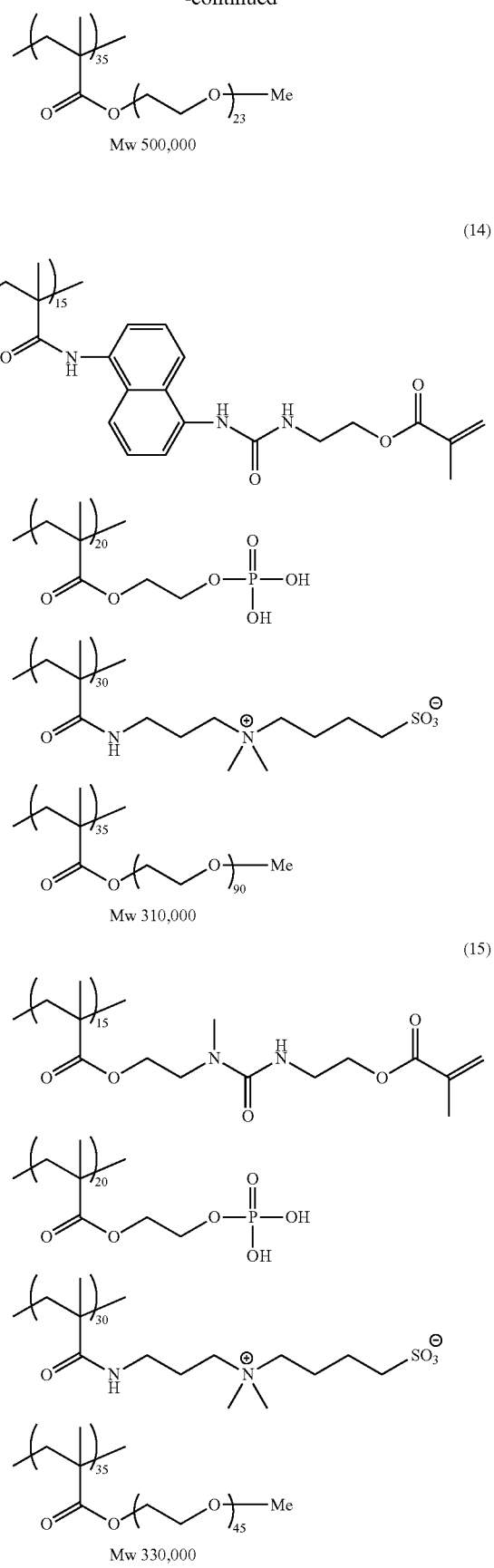

(16)
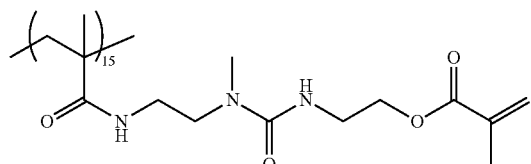
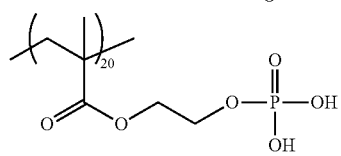
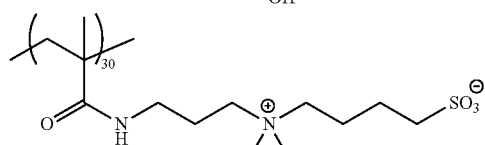
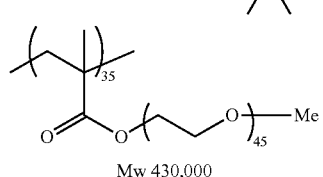
Mw 430,000
(17)
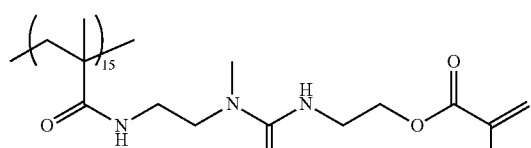
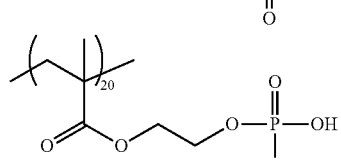
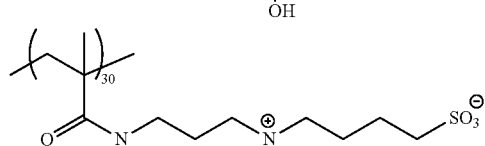
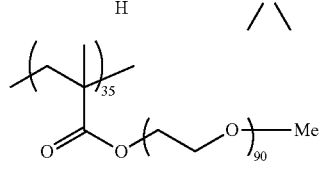
Mw 550,000
(18)
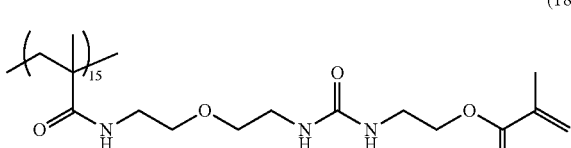
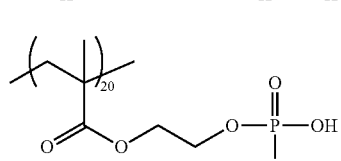
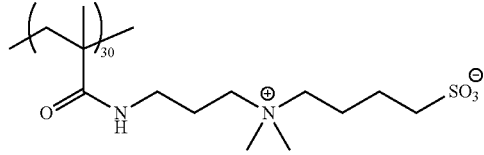
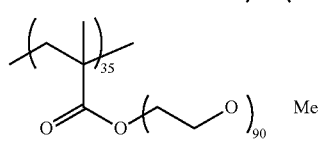
Mw 210,000
(19)
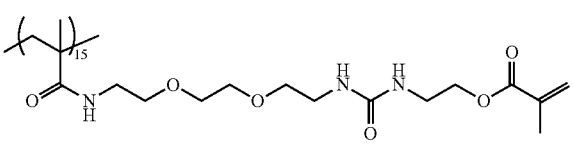
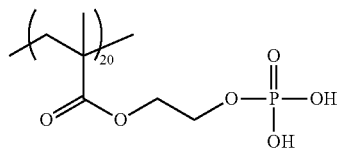
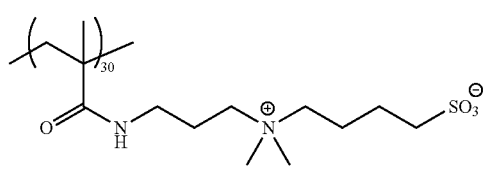
Mw 310,000
(20)
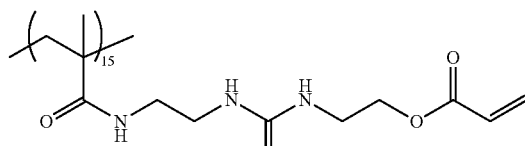
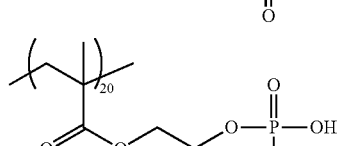
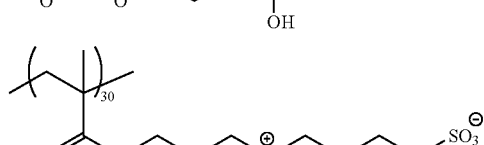
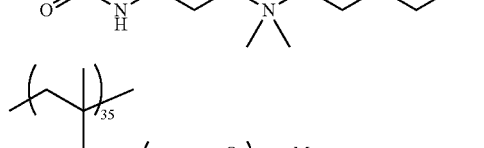
Mw 410,000

(21)
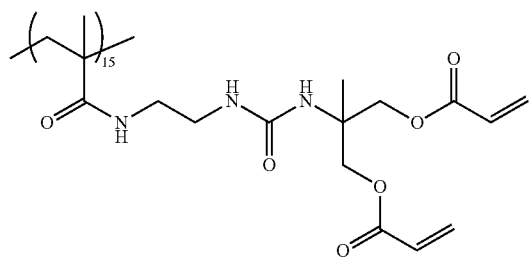
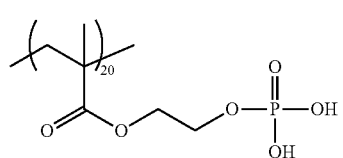
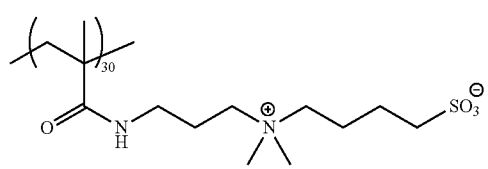
Mw 550,000
(22)
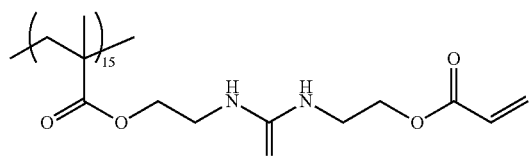
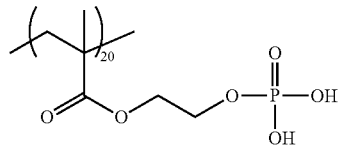
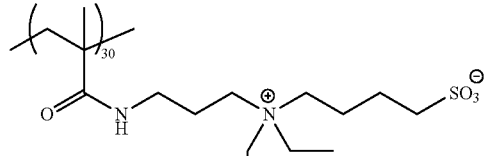
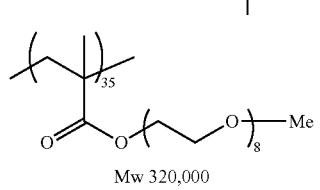
Mw 320,000
(23)
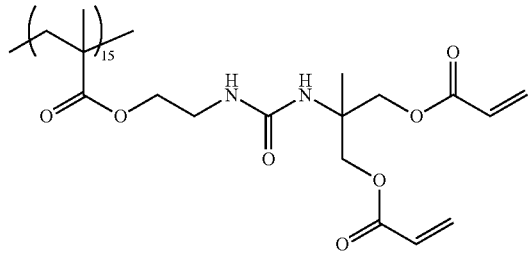
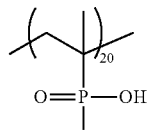
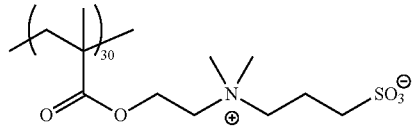
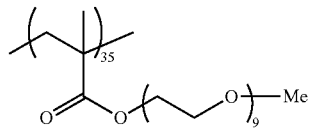
Mw 430,000
(24)
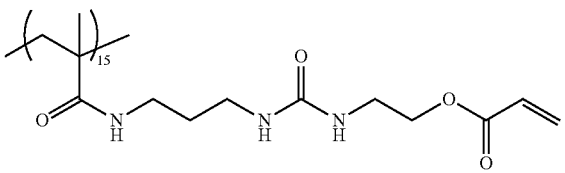
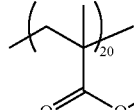
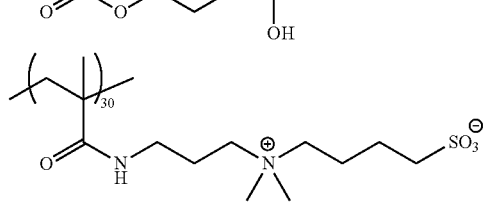
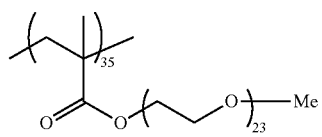
Mw 530,000
(25)
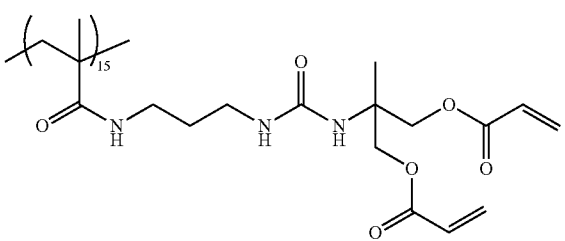

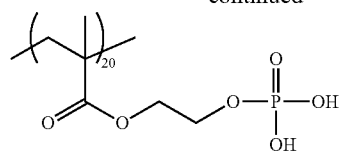
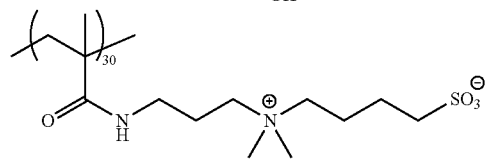
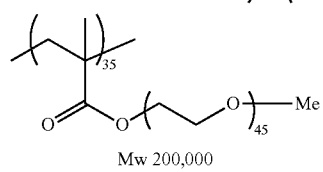
(26)
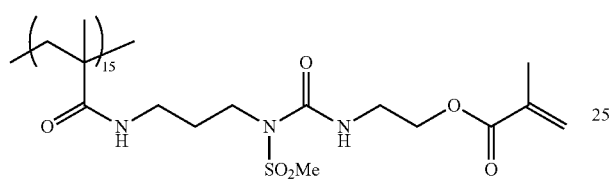
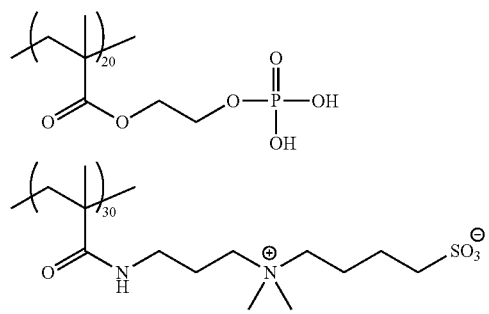
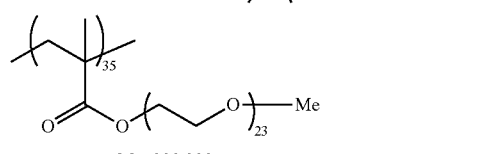
(27)
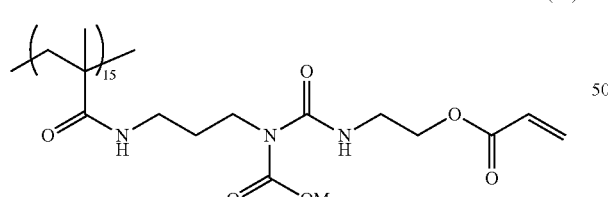
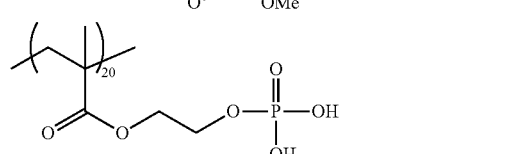
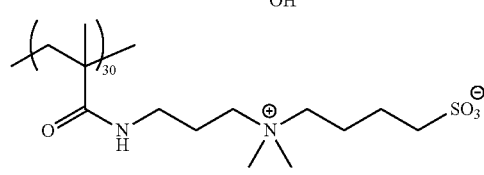
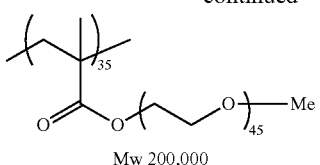
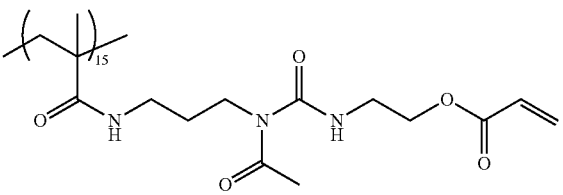
(28)
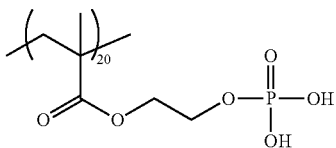
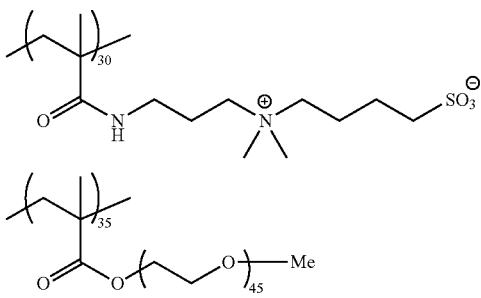
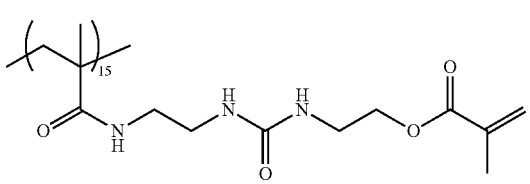
(29)
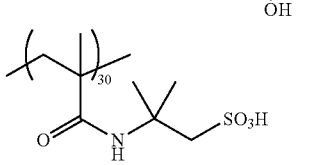
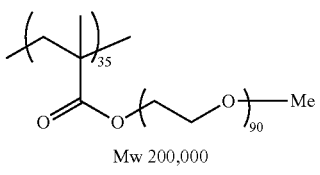

-continued
(30)
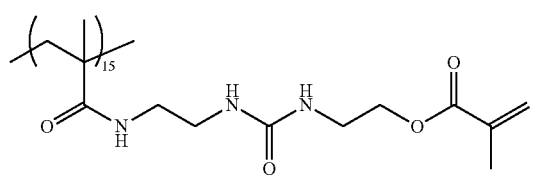
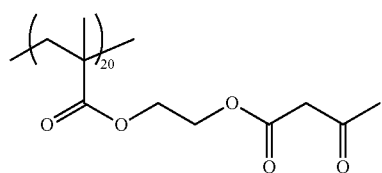
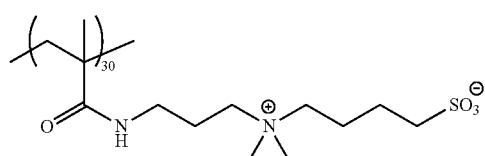
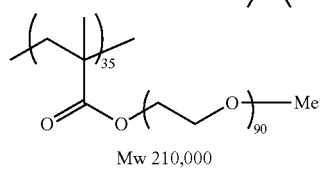
Mw 210,000
(31)
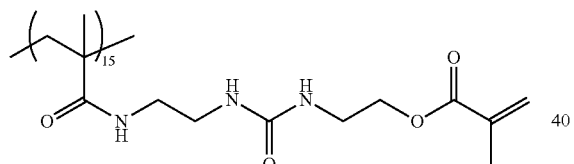
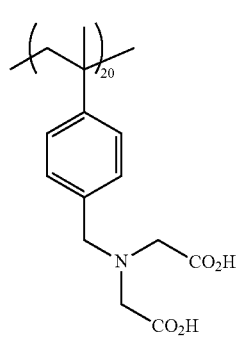
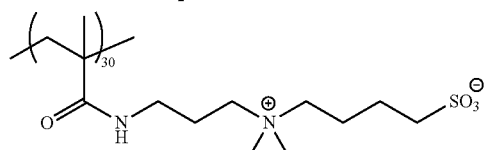
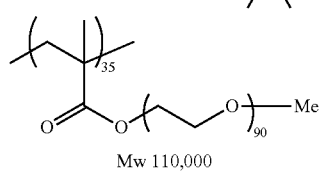
Mw 110,000
-continued
(32)
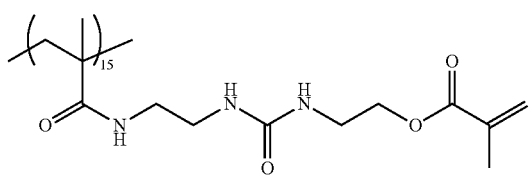
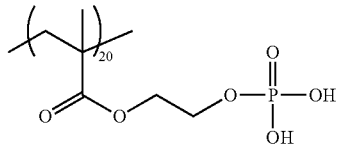
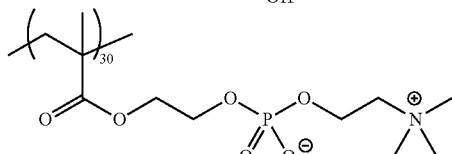
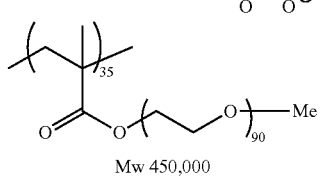
Mw 450,000
(33)
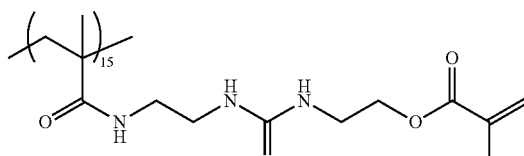
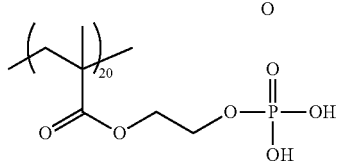
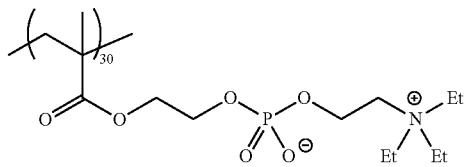
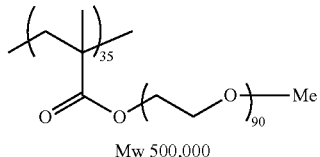
Mw 500,000
(34)
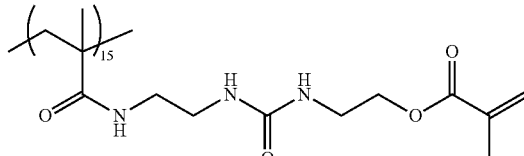
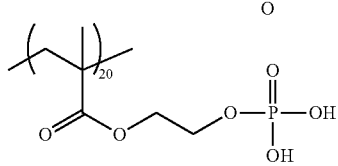

-continued
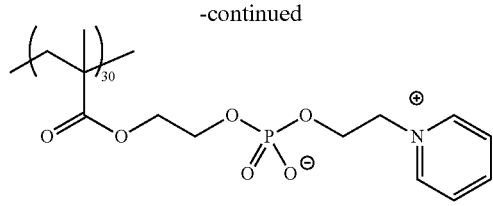
Mw 220,000
(35)
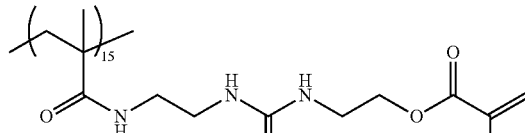
(37)
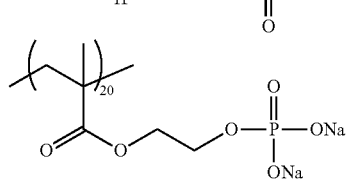
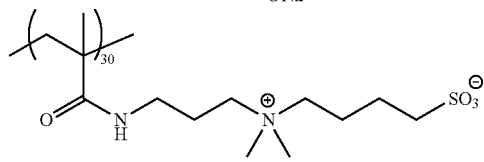
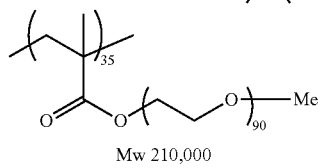
Mw 210,000
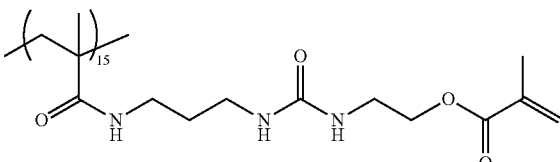
Mw 210,000
(38)
(36)
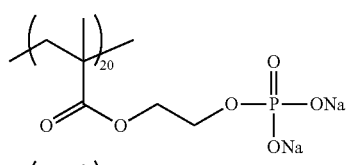
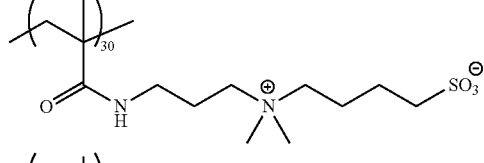
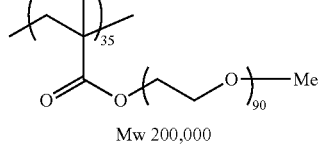
Mw 200,000
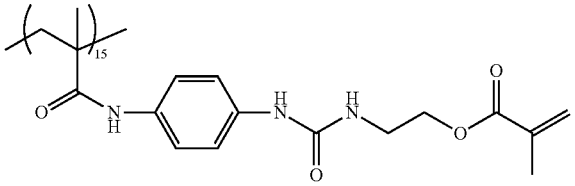
Mw 240,000
(39)
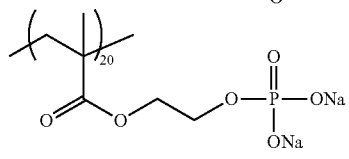

-continued
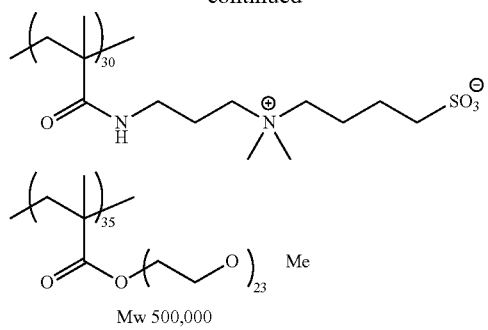
Mw 500,000
(40)
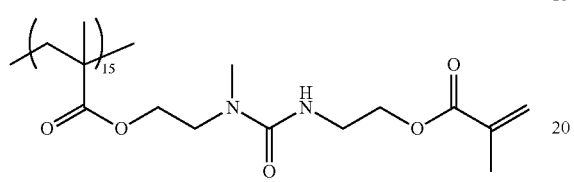
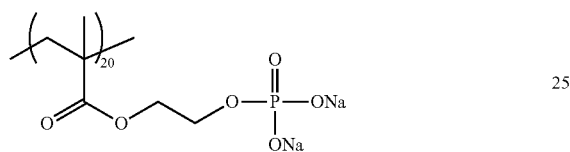
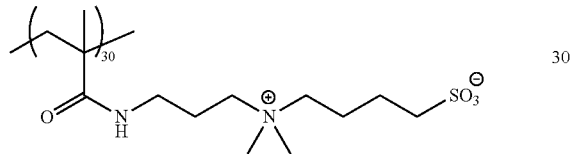
Mw 330,000
(41)
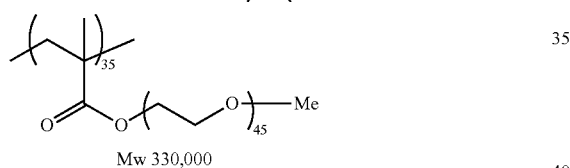
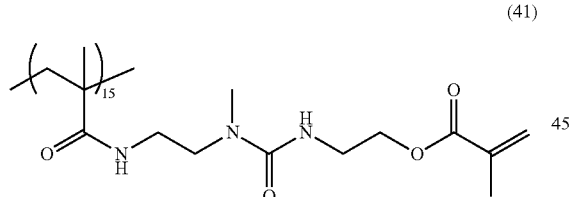
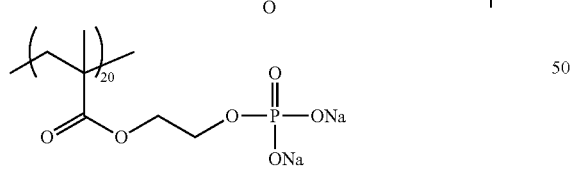
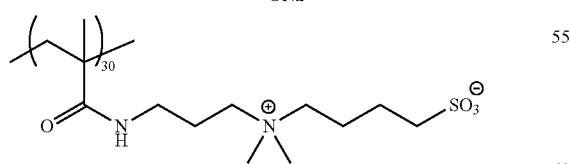
Mw 550,000
-continued
(42)
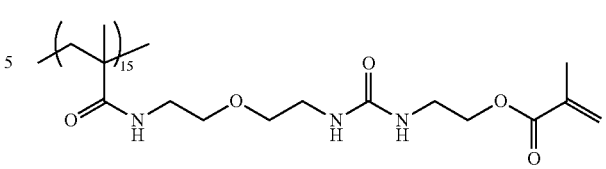
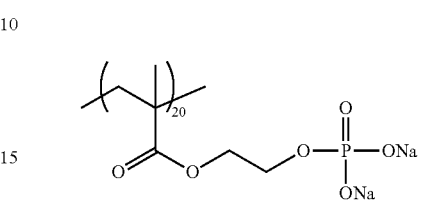
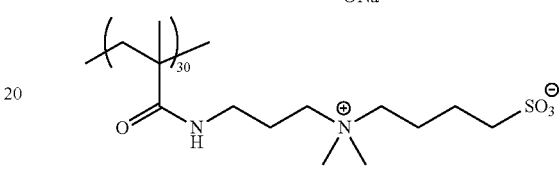
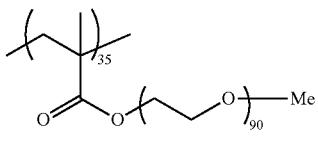
Mw 210,000
(43)
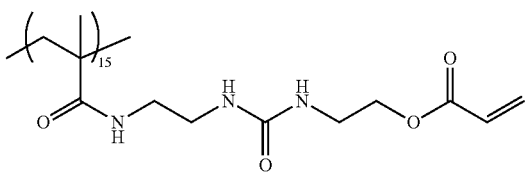
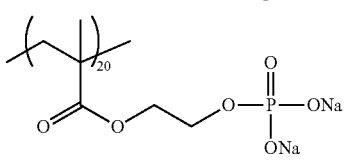
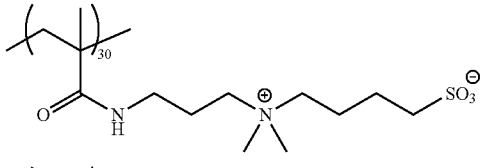
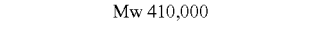
Mw 410,000
(44)
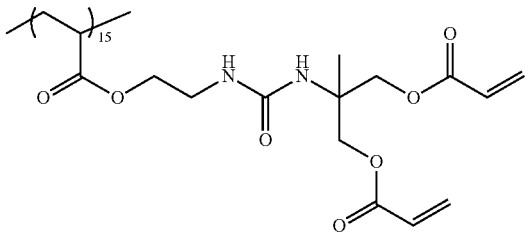

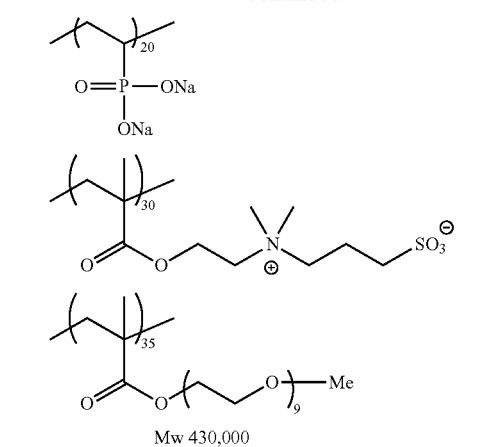
(45)
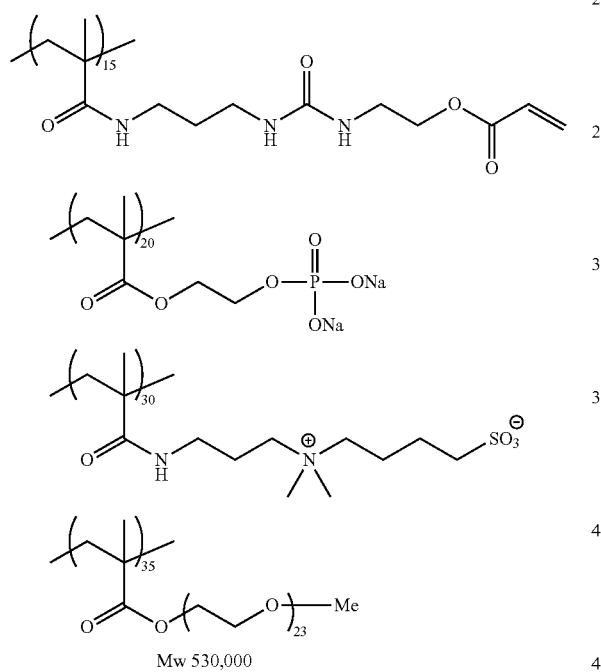
(46)
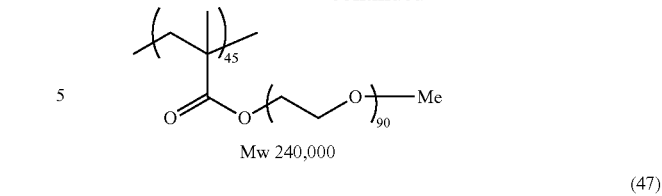
(47)
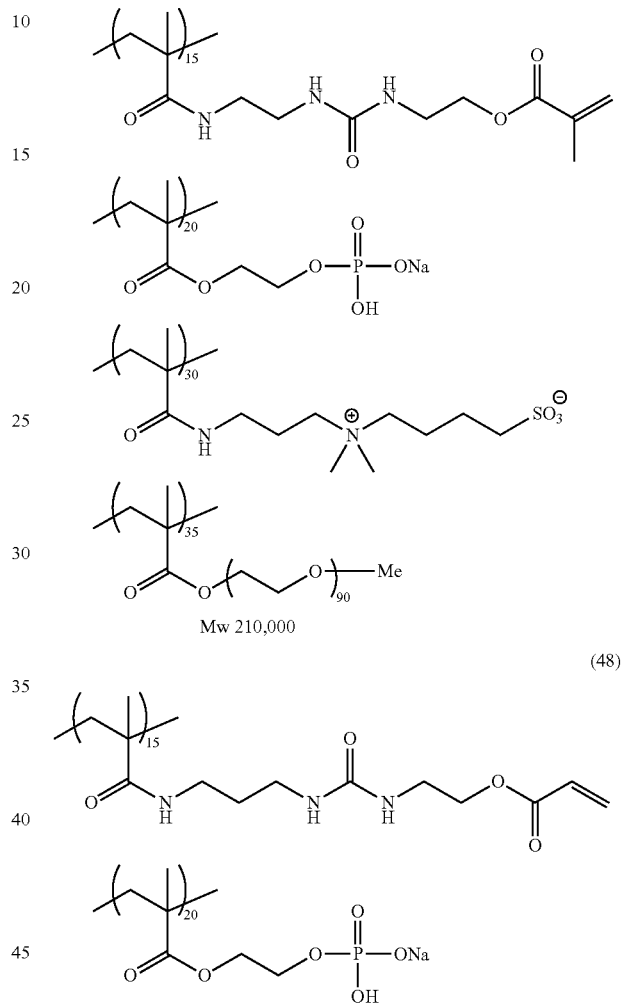
(48)
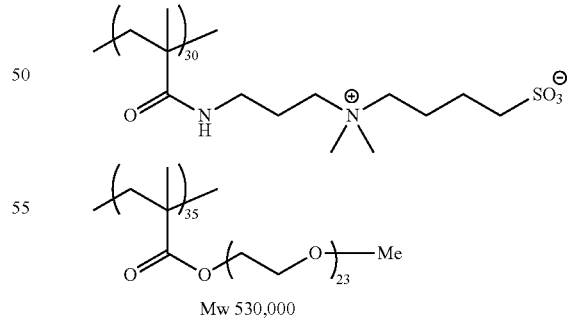
The coating amount of the specific polymer compound according to the invention in the intermediate layer is preferably from 0.1 to 100 mg/m², more preferably from 1 to 50 mg/m², and most preferably from 5 to 30 mg/m². In the range described above, the good effect of the invention is obtained.

[Compound Having Molecular Weight of 1,500 or Less and Oxyalkylene Group (Hereinafter, Also Referred to as "Specific Low Molecular Weight Compound")]

In the compound (specific low molecular weight compound) having a molecular weight of 1,500 or less and an oxyalkylene group, a polyoxyalkylene group is preferred as the oxyalkylene group. The oxyalkylene group is more preferably a polyoxyethylene group or a polyoxypropylene group and particularly preferably a polyoxyethylene group. A repeating unit number of the oxyethylene unit or oxypropylene unit is preferably from 1 to 30, more preferably from 1 to 20, still more preferably from 2 to 20, and particularly preferably from 2 to 15.

The specific low molecular weight compound may be either an ionic compound or a nonionic compound.

(Ionic Compound)

As the ionic compound, a compound having a polyoxyalkylene group and an acid group or a salt thereof is particularly preferred. Of the acid groups, salts of acid groups of (1) to (3) described below are preferred.

(1) Carboxylic acid group (—CO$_2$H)
(2) Sulfonic acid group (—SO$_3$H)
(3) Phosphoric acid group (—OPO$_3$H)

Of the acid groups selected from (1) to (3), (2) sulfonic acid group is preferred.

As a cationic group for forming a salt with the acid group described above, any cationic group can be used without particular restriction. Of the cationic groups, an inorganic cationic group, for example, a lithium cation, a sodium cation or a potassium cation and an organic cationic group, for example, a quaternary ammonium group or a quaternary phosphonium group are preferred.

In the case where the specific low molecular weight compound is an ionic compound according to the invention, a compound represented by formula (1A) shown below or a compound having a structure represented by formula (1B) shown below is particularly preferred.

<Compound Represented by Formula (1A)>

Hereinafter, the compound represented by formula (1A) is described.

R—Z—Y—X          (1A)

In formula (1A), R represents a substituted or unsubstituted alkyl group, alkenyl group, alkynyl group, aryl group or heterocyclic group, Z represents a polyoxyethylene group or a polyoxypropylene group, Y represents a substituted or unsubstituted alkylene group having 18 or less carbon atoms, a substituted or unsubstituted arylene group having 30 or less carbon atoms or a divalent heterocyclic skeleton, and X represents an acid group or a salt thereof.

Specific examples of the alkyl group represented by R include a straight-chain, branched or cyclic alkyl group having from 1 to 30 carbon atoms, for example, a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamantyl group or a 2-norbornyl group.

Specific examples of the alkenyl group represented by R include a straight-chain, branched or cyclic alkenyl group having from 1 to 30 carbon atoms, for example, a vinyl group, a 1-propenyl group, a 1-butenyl group, a 1-methyl-1-propenyl group, a cyclopentenyl group or a cyclohexenyl group.

Specific examples of the alkynyl group represented by R include an alkynyl group having from 1 to 30 carbon atoms, for example, an ethynyl group, a 1-propynyl group, a 1-butynyl group or a 1-octynyl group.

Examples of the substituent which the group represented by R may have include a monovalent non-metallic atomic group exclusive of a hydrogen atom, for example, a halogen atom (e.g., —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, N'-arylureido group, an N',N'-diarylureido group, an N'-alkyl-N'-arylureido group, an N-alkylureido group, N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and a conjugate base group thereof, an alkoxycarbonyl group, an aryloxycarbonyl group, an N-alkylaminocarbonyl group, an N,N-dialkylaminocarbonyl group, an N-arylaminocarbonyl group, an N,N-diarylaminocarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and a conjugate base group thereof, an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and a conjugate base group thereof, an N-alkylsulfonylsulfamoyl group (—SO$_2$NHSO$_2$(alkyl)) and a conjugate base group thereof, an N-arylsulfonylsulfamoyl group (—SO$_2$NHSO$_2$(aryl)) and a conjugate base group thereof, an N-alkylsulfonylcarbamoyl group (—CONHSO$_2$(alkyl)) and a conjugate base group thereof, an N-arylsulfonylcarbamoyl group (—CONHSO$_2$(aryl)) and a conjugate base group thereof, an alkoxysilyl group (—Si(O-alkyl)$_3$), an aryloxysilyl group (—Si(O-aryl)$_3$), a hydroxysilyl group (—Si(OH)$_3$) and a conjugate base group thereof, a phosphono group (—PO$_3$H$_2$) and a conjugate base group thereof, a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and a conjugate base group thereof, a monoarylphosphono group (—PO$_3$H(aryl))

and a conjugate base group thereof a phosphonoxy group (—OPO$_3$H$_2$) and a conjugate base group thereof, a dialkylphosphonoxy group (—OPO$_3$(alkyl)$_2$), a diarylphosphonoxy group (—OPO$_3$(aryl)$_2$), an alkylarylphosphonoxy group (—OPO$_3$(alkyl)(aryl)), a monoalkylphosphonoxy group (—OPO$_3$H(alkyl)) and a conjugate base group thereof, a monoarylphosphonoxy group (—OPO$_3$H(aryl)) and a conjugate base group thereof, a cyano group, a nitro group, a dialkylboryl group (—B(alkyl)$_2$), a diarylboryl group (—B(aryl)$_2$), an alkylarylboryl group (—B(alkyl)(aryl)), a dihydroxyboryl group (—B(OH)$_2$) and a conjugate base group thereof, an alkylhydroxyboryl group (—B(alkyl)(OH)) and a conjugate base group thereof, an arylhydroxyboryl group (—B(aryl)(OH)) and a conjugate base group thereof, an aryl group, an alkenyl group or an alkynyl group.

Particularly, an alkoxy group, an aryloxy group, an alkoxycarbonyl group, an aryloxycarbonyl group, an N-alkylaminocarbonyl group, an N,N-dialkylaminocarbonyl group, an N-arylaminocarbonyl group or an N,N-diarylaminocarbonyl group is preferred.

Specific examples of the aryl group and heterocyclic group represented by R include an aryl group having from 1 to 30 carbon atoms, for example, a phenyl group, a naphthyl group or an indenyl group and a heteroaryl group having from 1 to 30 carbon atoms and containing one hetero atom selected from the group consisting of a nitrogen atom, an oxygen atom and a sulfur atom, for example, a furyl group, a thienyl group, a pyrrolyl group, a pyridyl group or a quinolyl group.

For R in formula (1A) according to the invention, the alkyl group is particularly preferred.

Z represents a polyoxyethylene group or a polyoxypropylene group in which a number of repeating unit is preferably from 1 to 30, more preferably from 1 to 20, still more preferably from 2 to 20, and particularly preferably from 2 to 15.

Specific examples of the alkylene group represented by Y include a straight-chain, branched or cyclic alkylene group having from 1 to 30 carbon atoms, for example, a methylene group, an ethylene group, a propylene group, a butylene group, a pentylene group, a hexylene group, a heptylene group, an octylene group, a nonylene group, a decylene group, a cyclopentylene group, a cyclohexylene group, an adamantylene group or a norbornylene group.

Specific examples of the arylene group and divalent heterocyclic group represented by Y include an arylene group having from 1 to 30 carbon atoms, for example, a phenylene group, a naphthylene group or an indenylene group and a heteroaryl group having from 1 to 30 carbon atoms and containing one hetero atom selected from the group consisting of a nitrogen atom, an oxygen atom and a sulfur atom, for example, a divalent group derived from furan, thiophene, pyrroline, pyridine or quinoline, respectively.

Of the groups represented by Y, the alkylene group is preferred.

The acid group and salt thereof represented by X is preferably any acid group of (1) to (3) described below or salt thereof and more preferably the salt of acid group.
(1) Carboxylic acid group (—CO$_2$H)
(2) Sulfonic acid group (—SO$_3$H)
(3) Phosphoric acid group (—OPO$_3$H$_2$)

Of the acid groups selected from (1) to (3), (2) sulfonic acid group is preferred.

The cationic group for forming the salt with the acid group in X is not particularly restricted as long as it is a cationic group.

Of the cationic groups, an inorganic cationic group, for example, a lithium cation, a sodium cation or a potassium cation and an organic cationic group, for example, a quaternary ammonium group or a quaternary phosphonium group are preferred.

Specific examples of the compound represented by formula (1A) are set forth below, but the invention should not be construed as being limited thereto.

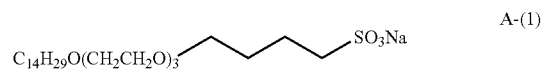

A-(1)

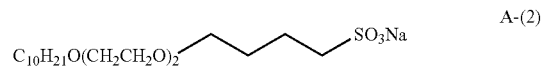

A-(2)

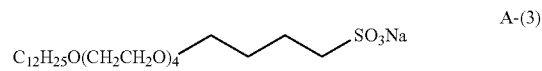

A-(3)

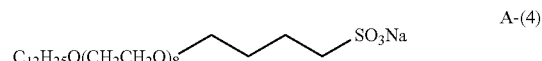

A-(4)

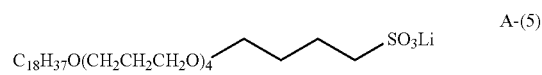

A-(5)

A-(6)

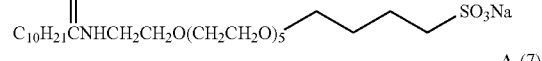

A-(7)

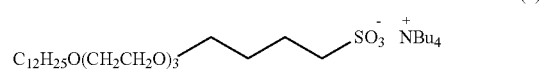

A-(8)

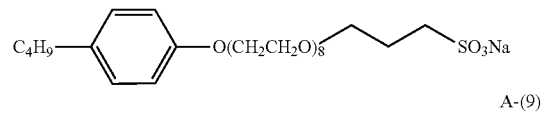

A-(9)

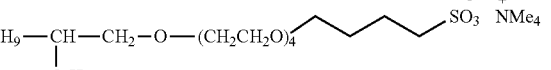

A-(10)

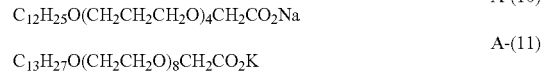

A-(11)

A-(12)

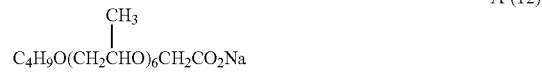

A-(13)

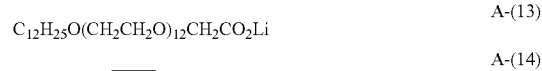

A-(14)

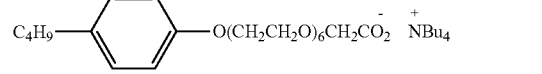

A-(15)

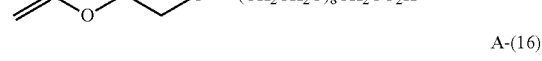

A-(16)

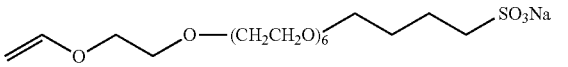

A-(17)

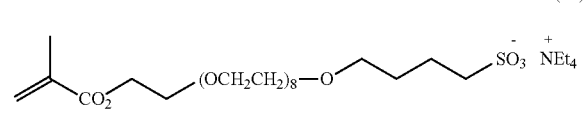

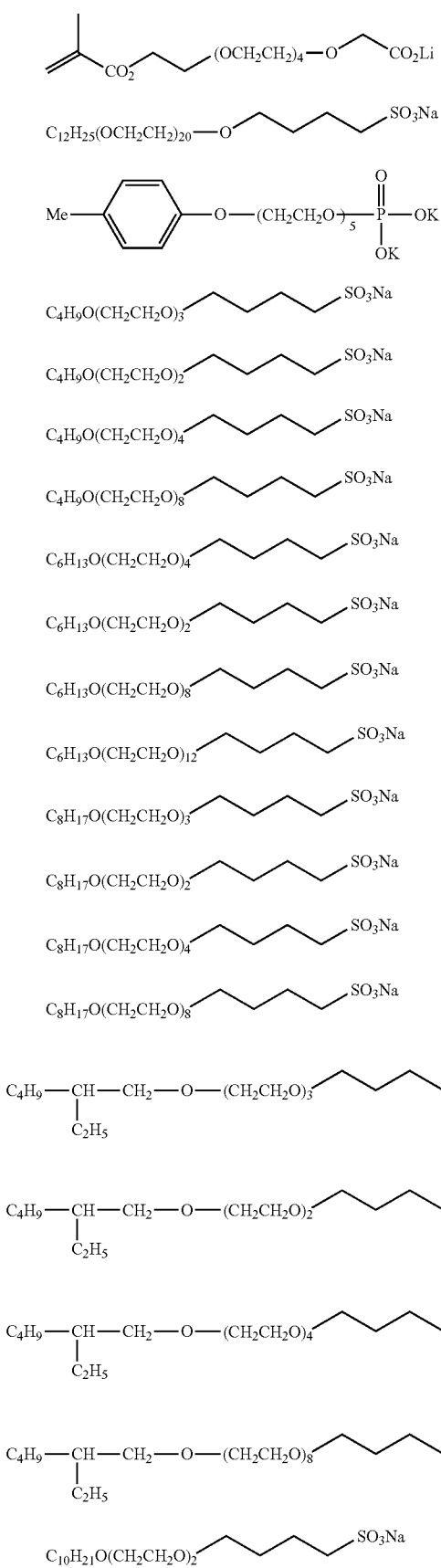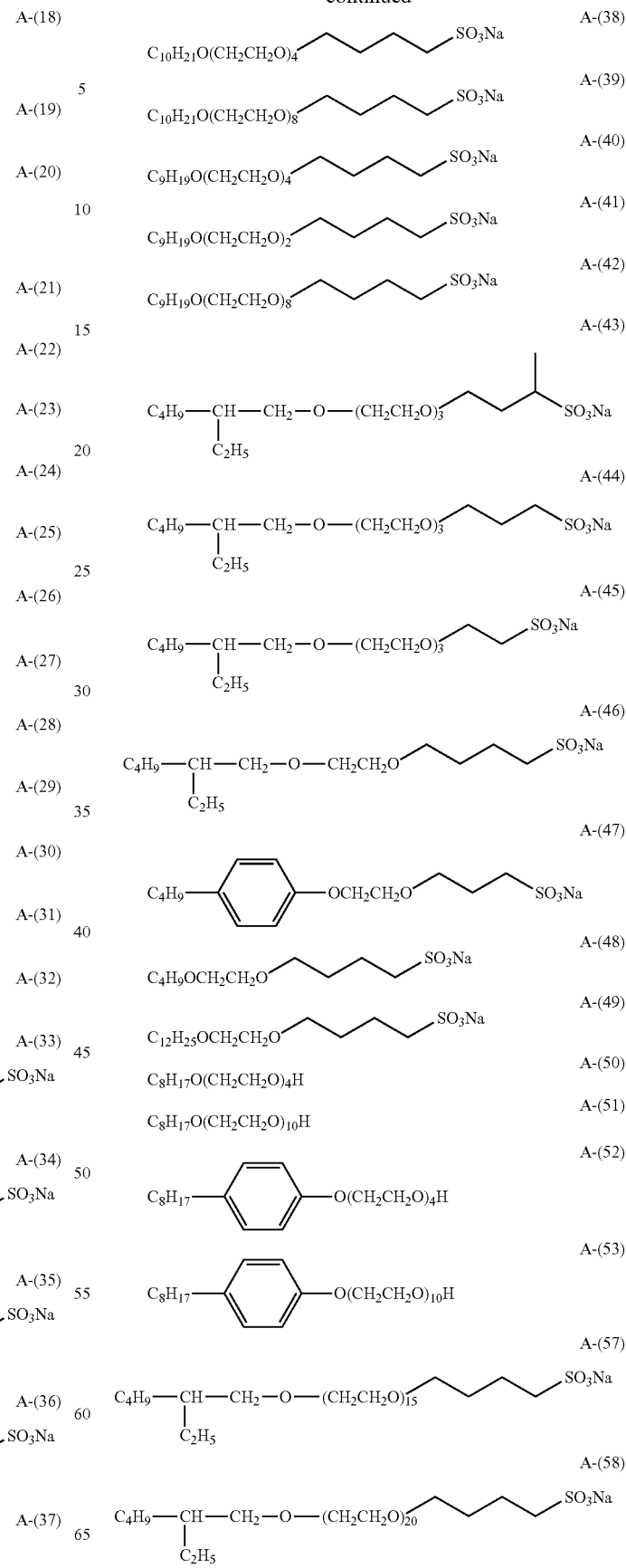

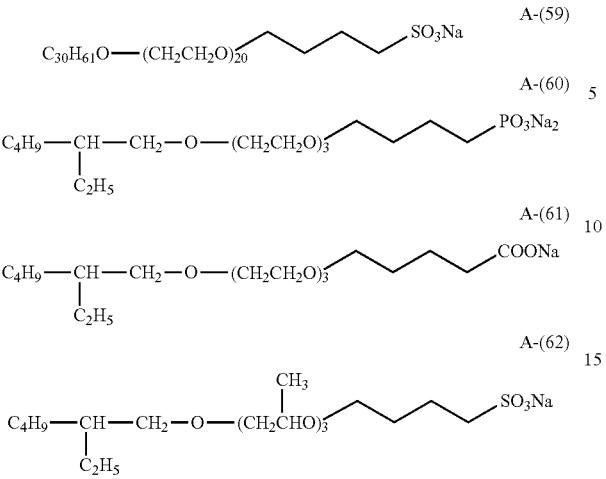

<Compound Having Structure Represented by Formula (1B)>

Hereinafter, the compound having a structure represented by formula (1B) is described.

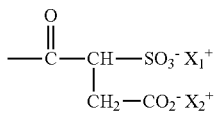
(1B)

In formula (1B), $X_1^+$ and $X_2^+$, which may be the same or different, each represents H$^+$ or a monovalent cationic group, or one divalent cationic group may be present in place of $X_1^+$ and $X_2^+$.

Examples of the monovalent cationic group include an inorganic cationic group, for example, a lithium cation, a sodium cation or a potassium cation and an organic cationic group, for example, a quaternary ammonium group or a quaternary phosphonium group. Examples of the divalent cationic group include a cation having two organic cationic groups, for example, a quaternary ammonium group or a quaternary phosphonium group in its molecule and a divalent inorganic cation, for example, a magnesium ion or a calcium ion.

Of the cationic groups, a sodium ion is particularly preferred.

The compound having a structure represented by formula (1B) contains an oxyalkylene group in its molecule. The oxyalkylene group is more preferably a polyoxyethylene group or a polyoxypropylene group. A repeating unit number of oxyethylene unit or oxypropylene unit is preferably from 1 to 30, more preferably from 1 to 20, still more preferably from 2 to 20, and particularly preferably from 2 to 15. By containing the polyoxyethylene group or polyoxypropylene group, the on-press development property is improved. The repeating unit number of oxyethylene unit or oxypropylene unit of 30 or less is preferred, because solubility in a coating solution is good.

Of the compounds having a structure represented by formula (1B), a compound having a structure represented by formula (1B2) shown below is particularly preferred.

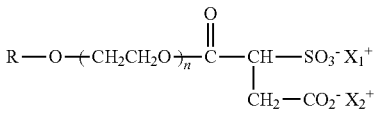
(1B2)

In the formula above, R represents an alkyl group which may have a substituent or an aryl group which may have a substituent. n represents an integer from 0 to 20, more preferably from 2 to 20, and particularly preferably from 2 to 15. $X_1^+$ and $X_2^+$ have the same meanings as $X_1^+$ and $X_2^+$ in formula (1B), respectively.

The alkyl group may be any of a straight-chain, branched and cyclic form and has preferably from 1 to 20 carbon atoms, more preferably from 1 to 16 carbon atoms, and most preferably from 1 to 12 carbon atoms. Specific examples of the alkyl group include a methyl group, an ethyl group, a butyl group, a 2-ethylhexyl group, a cyclohexyl group, a decyl group, a dodecyl group and a hexadecyl group. Examples of the substituent for the alkyl group include a fatty acid amido group and an alkoxy group each having 20 or less carbon atoms.

Examples of the aryl group include a phenyl group, a butylphenyl group, an amylphenyl group, an octylphenyl group and a nonylphenyl group.

The compound having a structure represented by formula (1B) may have two or more structures represented by formula (1B). Specific examples thereof include compounds in which plural groups formed by eliminating one hydrogen atom from R in formula (1B2) are connected through a single bond or a connecting group. The connecting group is not particularly restricted and includes an alkylene group, an arylene group, a divalent or higher-valent heterocyclic group and a trivalent or higher-valent hydrocarbon group.

Specific examples of the compound (1B) are set forth below, but the invention should not be construed as being limited thereto.

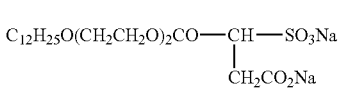
B-(1)

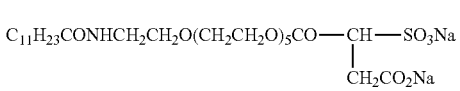
B-(2)

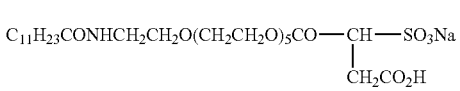
B-(3)

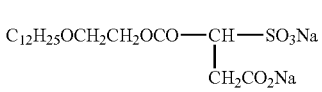
B-(4)

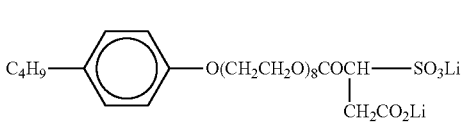
B-(5)

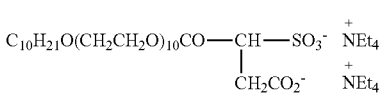
B-(6)

$$\text{B-(7)} \quad C_{10}H_{21}O(CH_2CH_2O)_6CO-\underset{\underset{CH_2CO_2^-}{|}}{CH}-SO_3^- \cdots {}^+N(CH_3)_2CH_2CH_2N^+(CH_3)_3$$

$$\text{B-(8)} \quad MeO(CH_2CHO)_6CO-\underset{\underset{CH_2CO_2^-}{|}}{CH}-SO_3^- \quad (\text{Me branch})$$

$$Ph_3P^+-(CH_2)_8-P^+Ph_3$$

$$\text{B-(9)} \quad C_4H_9O(CH_2CH_2O)_8-CO-\underset{\underset{CH_2CO_2^-}{|}}{CH}-SO_3^- \quad Ca^{+2}$$

$$\text{B-(10)} \quad \text{Cyclohexyl-}O(CH_2CH_2O)_4-CO-\underset{\underset{CH_2CO_2Na}{|}}{CH}-SO_3Na$$

$$\text{B-(11)} \quad \text{2-ethylhexyl-}O(CH_2CH_2O)_6-CO-\underset{\underset{CH_2CO_2K}{|}}{CH}-SO_3K$$

$$\text{B-(12)} \quad C_4H_9\text{-}C_6H_4\text{-}O(CH_2CH_2O)_6-COCH(SO_3Na)CH_2CO_2Na$$

$$\text{B-(13)} \quad \begin{array}{l} O(CH_2CH_2O)_4COCH(SO_3Na)CH_2CO_2Na \\ | \\ (CH_2)_{12} \\ | \\ O(CH_2CH_2O)_4COCH(\text{s-Bu})CH_2CO_2Na \end{array}$$

$$\text{B-(14)} \quad \text{Bisphenol-A-bis[}O(CH_2CH_2O)_4COCH(SO_3Na)CH_2CO_2Na\text{]}$$

$$\text{B-(15)} \quad \text{Triazine tris[}CH_2OCOCH(SO_3Na)CH_2CO_2Na\text{]}$$

$$\text{B-(16)} \quad C_{12}H_{25}O(CH_2CH_2O)_6COCH(SO_3Na)CH_2CO_2Na$$

$$\text{B-(17)} \quad C_{12}H_{25}O(CH_2CH_2O)_{10}COCH(SO_3Na)CH_2CO_2Na$$

$$\text{B-(18)} \quad C_{12}H_{25}O(CH_2CH_2O)_{18}CO-\underset{\underset{CH_2CO_2Na}{|}}{CH}-SO_3Na$$

$$\text{B-(19)} \quad C_{11}H_{23}CONHCH_2CH_2O(CH_2CH_2O)_{10}CO-\underset{\underset{CH_2CO_2Na}{|}}{CH}-SO_3Na$$

$$\text{B-(20)} \quad C_{11}H_{23}CONHCH_2CH_2O(CH_2CH_2O)_{16}CO-\underset{\underset{CH_2CO_2Li}{|}}{CH}-SO_3Li$$

$$\text{B-(21)} \quad C_8H_{17}CONHCH_2CH_2O(CH_2CH_2O)_4CO-\underset{\underset{CH_2CO_2Na}{|}}{CH}-SO_3Na$$

$$\text{B-(22)} \quad C_8H_{17}CONHCH_2CH_2O(CH_2CH_2O)_8CO-\underset{\underset{CH_2CO_2H}{|}}{CH}-SO_3Na$$

$$\text{B-(23)} \quad \text{2-ethylhexyl-}CONHCH_2CH_2O(CH_2CH_2O)_4CO-\underset{\underset{CH_2CO_2Na}{|}}{CH}-SO_3Na$$

$$\text{B-(24)} \quad \text{2-ethylhexyl-}CONHCH_2CH_2O(CH_2CH_2O)_{12}CO-\underset{\underset{CH_2CO_2H}{|}}{CH}-SO_3Na$$

$$\text{B-(25)} \quad C_6H_{13}CONHCH_2CH_2O(CH_2CH_2O)_4CO-\underset{\underset{CH_2CO_2Na}{|}}{CH}-SO_3Na$$

$$\text{B-(26)} \quad C_6H_{13}CONHCH_2CH_2O(CH_2CH_2O)_4CO-\underset{\underset{CH_2CO_2H}{|}}{CH}-SO_3Na$$

$$\text{B-(27)} \quad C_4H_9CONHCH_2CH_2O(CH_2CH_2O)_4CO-\underset{\underset{CH_2CO_2Na}{|}}{CH}-SO_3Na$$

$$\text{B-(28)} \quad C_4H_9CONHCH_2CH_2O(CH_2CH_2O)_8CO-\underset{\underset{CH_2CO_2H}{|}}{CH}-SO_3Na$$

$$\text{B-(29)} \quad C_{12}H_{25}OCH_2OCH_2OCO-\underset{\underset{CH_2CO_2Na}{|}}{CH}-SO_3Na$$

-continued $C_{12}H_{25}O(CH_2CH_2O)_3CO-CH-SO_3Na$
                              |
                              $CH_2CO_2Na$
B-(30)

$C_{12}H_{25}O(CH_2CH_2O)_8CO-CH-SO_3Na$
                              |
                              $CH_2CO_2Na$
B-(31)

$C_{12}H_{25}O(CH_2CH_2O)_{15}CO-CH-SO_3Na$
                                |
                                $CH_2CO_2Na$
B-(32)

$C_{12}H_{25}O(CH_2CH_2O)_{20}CO-CH-SO_3Na$
                                |
                                $CH_2CO_2Na$
B-(33)

$\quad\quad CH_3$
$\quad\quad\;|$
$C_{12}H_{25}O(CH_2CHO)_3CO-CH-SO_3Na$
                            |
                            $CH_2CO_2Na$
B-(34)

The compound having a structure represented by formula (1B) according to the invention can be synthesized by a known method described, for example, in JP-A-2002-356697.

<Compound Represented by Formula (1C)>

In the invention, a sulfate represented by formula (1C) shown below is capable to be used as the specific low molecular weight compound.

$H_3C-(O-CH_2CH_2)_n-O-S(=O)_2-ONa$ (1C)

In formula (1C), n represents an integer from 1 to 20, more preferably from 2 to 20, and particularly preferably from 2 to 15.

Specific examples of the sulfate represented by formula (1C) include compounds set forth below.

$H_3C-(OCH_2CH_2)_2-O-S(=O)_2-ONa$    C-(1)

$H_3C-(OCH_2CH_2)_8-O-S(=O)_2-ONa$    C-(2)

$H_3C-(OCH_2CH_2)_{20}-O-S(=O)_2-ONa$    C-(3)

(Nonionic Compound)

As the nonionic compound of the specific low molecular weight compound, for example, a compound represented by formula (1D1) or (1D2) shown below is exemplified. The oxyalkylene group is preferably a polyoxyethylene group (R=H) or a polyoxypropylene group (R=CH$_3$), and more preferably a polyoxyethylene group. A preferred number of repeating unit of the oxyalkylene group is same as in formula (1A) or formula (1B), but it is necessary that the molecular weight is 1,500 or less.

Specific examples of the compound include Compounds (D-1) to (D-7) set forth below.

[Isocyanurate ring structure with three N-substituents bearing $-(CH_2)_3-(OCH_2CH(R))_n-OH$ chains]

D - (1): $n = 4$, R = H
D - (2): $n = 8$, R = H
D - (3): $n = 9$, R = H (1D1) R=H or an alkyl group $H_3C-O-(CH_2CH(R)-O)_n-CH_3$ D - (5): $n = 4$, R = H
D - (6): $n = 8$, R = H
D - (7): $n = 20$, R = H (1D2) R=H or an alkyl group The coating amount of the specific low molecular weight compound according to the invention in the intermediate layer or image-recording layer is preferably from 1 to 200 mg/m$^2$, more preferably from 10 to 100 mg/m$^2$, and most preferably from 20 to 80 mg/m$^2$. The total coating amount in the case where the specific low molecular weight compound is added in the intermediate layer and image-recording layer is preferably from 1 to 200 mg/m$^2$, more preferably from 10 to 100 mg/m$^2$, and most preferably from 20 to 80 mg/m$^2$.

In the range described above, a lithographic printing plate precursor having good on-press development property and being excellent in printing durability is obtained. The compounds may be used individually or as a mixture of two or more thereof.

[Polymerizable Image-Recording Layer]

The image-recording layer according to the invention is a polymerizable image-recording layer and necessary to be an image-recording layer capable of undergoing on-press development.

The representative image-forming embodiment enabling the on-press development included in the image-recording layer includes (1) an embodiment wherein (A) an infrared absorbing dye, (B) a radical polymerization initiator and (C) a radical polymerizable compound are included and an image area is cured utilizing a polymerization reaction and (2) an embodiment wherein (A) an infrared absorbing dye and (E) a polymer fine particle are included and a hydrophobic region (image area) is formed utilizing heat fusion or heat reaction of the polymer fine particle (such a polymer fine particle being also referred to as a hydrophobizing agent). A mixture of these two embodiments may also be used. For instance, the polymer fine particle may be incorporated into the image-recording layer of polymerizable image-recording layer (1), or the radical polymerization initiator (B), the radical polymerizable compound or the like may be incorporated into the image-recording layer of hydrophobizing precursor type (2) containing the polymer fine particle to provide a polymerization property. Among them, the embodiment of utilizing polymerization including the infrared absorbing dye (A), the radical polymerization initiator (B) and the radical polymerizable compound (C) is preferred.

Each of the components incorporated into the polymerizable image-recording layer will be described in order below. Hereinafter, the polymerizable image-recording layer is simply referred to as an image-recording layer.

(A) Infrared Absorbing Dye

The infrared absorbing dye has a function of converting the infrared ray absorbed to heat and a function of being excited by the infrared ray to perform electron transfer/energy transfer to a radical polymerization initiator described hereinafter. The infrared absorbing dye for use in the invention includes a dye having an absorption maximum in a wavelength range of 760 to 1,200 nm.

As the infrared absorbing dye, compounds described in Paragraph Nos. [0058] to [0087] of JP-A-2008-195018 can be used.

Of the dyes, a cyanine dye, a squarylium dye, a pyrylium salt or a nickel thiolate complex is particularly preferred. As a particularly preferred example of the dye, a cyanine dye represented by formula (a) shown below is exemplified.

Formula (a)

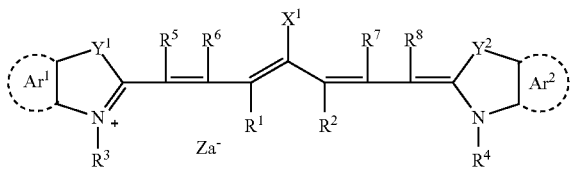

In formula (a), $X^1$ represents a hydrogen atom, a halogen atom, $-N(R^9)(R^{10})$, $-X^2-L^1$ or a group shown below. $R^9$ and $R^{10}$, which may be the same or different, each represents an aromatic hydrocarbon group having from 6 to 10 carbon atoms which may have a substituent, an alkyl group having from 1 to 8 carbon atoms which may have a substituent or a hydrogen atom, or $R^9$ and $R^{10}$ may be combined with each other to form a ring. $R^9$ and $R^{10}$ each preferably represents a phenyl group. $X^2$ represents an oxygen atom or a sulfur atom. $L^1$ represents a hydrocarbon group having from 1 to 12 carbon atoms, an aromatic ring group containing a hetero atom or a hydrocarbon group having from 1 to 12 carbon atoms and containing a hetero atom. The hetero atom as used herein indicates N, S, O, a halogen atom or Se. In the group shown below, $Xa^-$ has the same meaning as $Za^-$ defined hereinafter. $R^a$ represents a hydrogen atom or a substituent selected from an alkyl group, an aryl group, a substituted or unsubstituted amino group and a halogen atom.

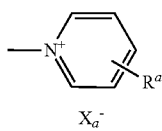

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms. Further, it is particularly preferred that $R^1$ and $R^2$ are combined with each other to form a 5-membered ring or a 6-membered ring.

$Ar^1$ and $Ar^2$, which may be the same or different, each represents an aromatic hydrocarbon group which may have a substituent. Preferred examples of the aromatic hydrocarbon group include a benzene ring group and a naphthalene ring group. Preferred examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms which may have a substituent. Preferred examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (a) has an anionic substituent in the structure thereof and neutralization of charge is not needed. Preferred examples of the counter ion for $Za^-$ include a halide ion, a perchlorate ion, a tetrafluoroborate ion, a hexafluorophosphate ion and a sulfonate ion, and particularly preferred examples thereof include a perchlorate ion, a hexafluorophosphate ion and an arylsulfonate ion in view of the preservation stability of a coating solution for image-recording layer.

Specific examples of the cyanine dye represented by formula (a), which can be preferably used in the invention, include cyanine dyes described in Paragraph Nos. [0017] to [0019] of JP-A-2001-133969, Paragraph Nos. [0012] to [0021] of JP-A-2002-23360 and Paragraph Nos. [0012] to [0037] of JP-A-2002-40638.

The infrared absorbing dyes (A) may be used only one kind or in combination of two or more kinds thereof and the cyanine dye may also be used together with an infrared absorbing agent other than the infrared absorbing dye, for example, a pigment. As the pigment, compounds described in Paragraph Nos. [0072] to [0076] of JP-A-2008-195018 are preferred.

The content of the infrared absorbing dye in the image-recording layer according to the invention is preferably from 0.1 to 10.0% by weight, more preferably from 0.5 to 5.0% by weight, based on the total solid content of the image-recording layer.

(B) Radical Polymerization Initiator

The radical polymerization initiator (B) which can be used in the invention indicates a compound which initiates or accelerates polymerization of the radical polymerizable compound (C). The radical polymerization initiator usable in the invention includes, for example, known thermal polymerization initiators, compounds containing a bond having small bond dissociation energy and photopolymerization initiators.

The radical polymerization initiator according to the invention include, for example, (a) an organic halide, (b) a carbonyl compound, (c) an azo compound, (d) an organic peroxide, (e) a metallocene compound, (f) an azide compound, (g) a hexaarylbiimidazole compound, (h) an organic borate compound, (i) a disulfone compound, (j) an oxime ester compound and (k) an onium salt compound.

As the organic halide (a), compounds described in Paragraph Nos. [0022] to [0023] of JP-A-2008-195018 are preferred.

As the carbonyl compound (b), compounds described in Paragraph No. [0024] of JP-A-2008-195018 are preferred.

As the azo compound (c), for example, azo compounds described in JP-A-8-108621 can be used.

As the organic peroxide (d), for example, compounds described in Paragraph No. [0025] of JP-A-2008-195018 are preferred.

As the metallocene compound (e), for example, compounds described in Paragraph No. [0026] of JP-A-2008-195018 are preferred.

As the azide compound (f), a compound, for example, 2,6-bis(4-azidobenzylidene)-4-methylcyclohexanone is exemplified.

As the hexaarylbiimidazole compound (g), for example, compounds described in Paragraph No. [0027] of JP-A-2008-195018 are preferred.

As the organic borate compound (h), for example, compounds described in Paragraph No. [0028] of JP-A-2008-195018 are preferred.

As the disulfone compound (i), for example, compounds described in JP-A-61-166544 and JP-A-2003-328465 are exemplified.

As the oxime ester compound (j), for example, compounds described in Paragraph Nos. [0028] to [0030] of JP-A-2008-195018 are preferred.

As the onium salt compound (k), onium salts, for example, diazonium salts described in S. I. Schlesinger, *Photogr. Sci. Eng.*, 18, 387 (1974), T. S. Bal et al., *Polymer*, 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Patent Publication No. 2008/0311520, JP-A-2-150848 and JP-A-2008-195018, sulfonium salts described in European Patents 370,693, 390,214, 233,567, 297,443 and 297,442, U.S. Pat. Nos. 4,933,377, 4,760,013, 4,734,444 and 2,833,827 and German Patents 2,904,626, 3,604,580 and 3,604,581, selenonium salts described in J. V. Crivello et al., *Macromolecules*, 10 (6), 1307 (1977) and J. V. Crivello et al., *J. Polymer Sci., Polymer Chem. Ed.*, 17, 1047 (1979), arsonium salts described in C. S. Wen et al., *Teh, Proc. Conf. Rad. Curing ASIA*, p. 478, Tokyo, October (1988), and azinium salts described in JP-A-2008-195018 are exemplified.

Of the radical polymerization initiators described above, the onium salt, in particular, the iodonium salt, the sulfonium salt or the azinium salt is more preferred. Specific examples of these compounds are set forth below, but the invention should not be construed as being limited thereto.

Of the iodonium salts, a diphenyliodonium salt is preferred. In particular, a diphenyliodonium salt substituted with an electron donating group, for example, an alkyl group or an alkoxy group is preferred, and an asymmetric diphenyliodonium salt is more preferred. Specific examples of the iodonium salt include diphenyliodonium hexafluorophosphate, 4-methoxyphenyl-4-(2-methylpropyl)phenyliodonium hexafluorophosphate, 4-(2-methylpropyl)phenyl-p-tolyliodonium hexafluorophosphate, 4-hexyloxyphenyl-2,4, 6-trimethoxyphenyliodonium hexafluorophosphate, 4-hexyloxyphenyl-2,4-diethoxyphenyliodonium tetrafluoroborate, 4-octyloxyphenyl-2,4,6-trimethoxyphenyliodonium 1-perfluorobutanesulfonate, 4-octyloxyphenyl-2,4,6-trimethoxyphenyliodonium hexafluorophosphate and bis(4-tert-butylphenyl)iodonium tetraphenylborate.

Examples of the sulfonium salt include triphenylsulfonium hexafluorophosphate, triphenylsulfonium benzoylformate, bis(4-chlorophenyl)phenylsulfonium benzoylformate, bis(4-chlorophenyl)-4-methylphenylsulfonium tetrafluoroborate and tris(4-chlorophenyl)sulfonium 3,5-bis(methoxycarbonyl)benzenesulfonate.

Examples of the azinium salt include 1-cyclohexylmethyloxypyridinium hexafluorophosphate, 1-cyclohexyloxy-4-phenylpyridinium hexafluorophosphate, 1-ethoxy-4-phenylpyridinium hexafluorophosphate, 1-(2-ethylhexyloxy)-4-phenylpyridinium hexafluorophosphate, 4-chloro-1-cyclohexylmethyloxypyridinium hexafluorophosphate, 1-ethoxy-4-cyanopyridinium hexafluorophosphate, 3,4-dichloro-1-(2-ethylhexyloxy)pyridinium hexafluorophosphate, 1-benzyloxy-4-phenylpyridinium hexafluorophosphate, 1-phenethyloxy-4-phenylpyridinium hexafluorophosphate, 1-(2-ethylhexyloxy)-4-phenylpyridinium p-toluenesulfonate, 1-(2-ethylhexyloxy)-4-phenylpyridinium perfluorobutanesulfonate, 1-(2-ethylhexyloxy)-4-phenylpyridinium bromide and 1-(2-ethylhexyloxy)-4-phenylpyridinium tetrafluoroborate.

The radical polymerization initiator can be added preferably in an amount from 0.1 to 50% by weight, more preferably from 0.5 to 30% by weight, particularly preferably from 0.8 to 20% by weight, based on the total solid content constituting the image-recording layer. In the range described above, good sensitivity and good stain resistance in the non-image area at the time of printing are obtained.

(C) Radical Polymerizable Compound

The radical polymerizable compound (C) which can be used in the invention is an addition-polymerizable compound having at least one ethylenically unsaturated double bond and it is selected from compounds having at least one, preferably two or more, terminal ethylenically unsaturated double bonds. Such compounds are widely known in the field of art and they can be used in the invention without any particular restriction. The radical polymerizable compound has a chemical form, for example, a monomer, a prepolymer, specifically, a dimer, a trimer or an oligomer or a mixture thereof, or a (co)polymer thereof.

Specific examples thereof include compounds described in Paragraph Nos. [0089] to [0098] of JP-A-2008-195018. Preferably, esters of an aliphatic polyhydric alcohol and an unsaturated carboxylic acid (for example, acrylic acid, methacrylic acid, itaconic acid, crotonic acid, isocrotonic acid or maleic acid) are exemplified. As another preferred radical polymerizable compound, polymerizable compounds having an isocyanuric acid structure descried in JP-A-2005-329708 are exemplified.

Of the compounds described above, an isocyanuric acid ethyleneoxide-modified acrylate, for example, tris(acryloyloxyethyl)isocyanurate or bis(acryloyloxyethyl)hydroxyethyl isocyanurate is particularly preferred from the standpoint of excellent balance between hydrophilicity relating to the on-press development property and polymerization ability relating to the printing durability.

According to the invention, the radical polymerizable compound (C) is used preferably in a range from 5 to 80% by weight, more preferably in a range from 15 to 75% by weight, based on the total solid content of the image-recording layer.

(D) Binder Polymer

In the image-recording layer according to the invention, a binder polymer can be used for the purpose of improving a film strength of the image-recording layer. The binder polymer which can be used in the invention can be selected from those heretofore known without restriction, and polymers having a film-forming property are preferred. Among them, an acrylic resin, a polyvinyl acetal resin and a polyurethane resin are preferred.

As the binder polymer preferable for the invention, a polymer having a crosslinkable functional group for improving film strength of the image area in its main chain or side chain, preferably in its side chain, as described in JP-A-2008-195018 is exemplified. Due to the crosslinkable functional group, crosslinkage is formed between the polymer molecules to facilitate curing.

As the crosslinkable functional group, an ethylenically unsaturated group, for example, a (meth)acryl group, a vinyl group or an allyl group, or an epoxy group is preferred. The crosslinkable functional group can be introduced into the polymer by a polymer reaction or copolymerization. For instance, a reaction between an acrylic polymer or polyurethane having a carboxyl group in its side chain and glycidyl methacrylate or a reaction between a polymer having an epoxy group and a carboxylic acid containing an ethylenically unsaturated group, for example, methacrylic acid can be utilized.

The content of the crosslinkable group in the binder polymer is preferably from 0.1 to 10.0 mmol, more preferably from 1.0 to 7.0 mmol, most preferably from 2.0 to 5.5 mmol, based on 1 g of the binder polymer.

It is also preferred that the binder polymer for use in the invention further contains a hydrophilic group. The hydrophilic group contributes to impart the on-press development property to the image-recording layer. In particular, coexistence of the crosslinkable group and the hydrophilic group makes it possible to maintain good balance between printing durability and development property.

The hydrophilic group includes, for example, a hydroxy group, a carboxyl group, an alkylene oxide structure, an amino group, an ammonium group, an amido group, a sulfo group and a phosphoric acid group. Among them, an alkylene oxide structure containing from 1 to 9 alkylene oxide units having 2 or 3 carbon atoms is preferred. In particular, a polyethylene oxide structure containing from 2 to 8 ethylene oxide units is preferred. In order to introduce a hydrophilic group into the binder polymer, a monomer having the hydrophilic group may be copolymerized.

Further, in order to control the ink-receptive property, an oleophilic group, for example, an alkyl group, an aryl group, an aralkyl group or an alkenyl group may be introduced into the binder polymer according to the invention. Specifically, an oleophilic group-containing monomer, for example, an alkyl methacrylate is copolymerized.

Specific examples (1) to (11) of the binder polymer for use in the invention are set forth below, but the invention should not be construed as being limited thereto. A ratio of the repeating units in the binder polymer shown below is indicated by a molar ratio.

(1)

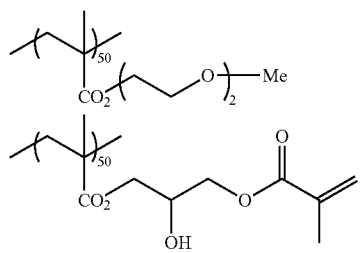

-continued (2)

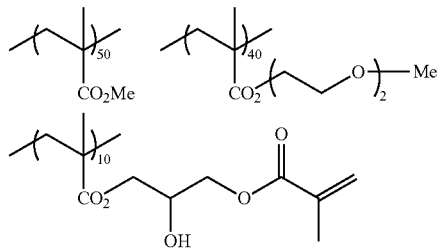

(3)

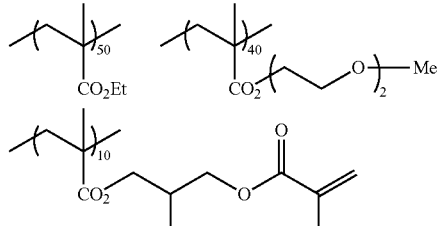

(4)

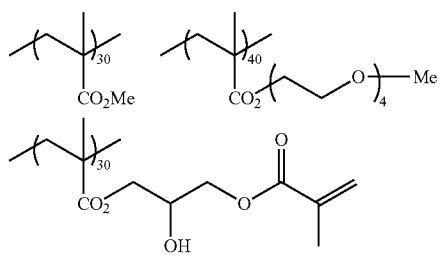

(5)

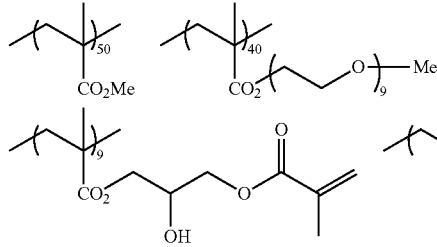

(6)

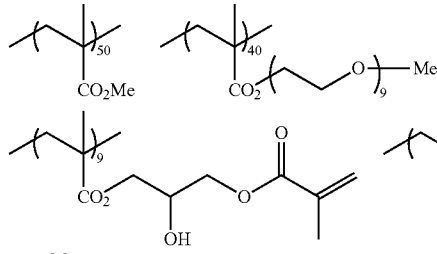

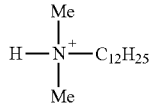

(7)

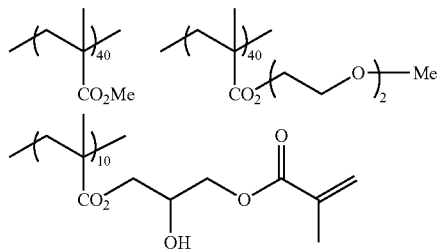

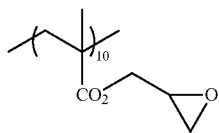

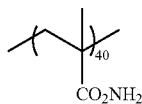 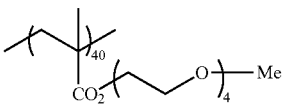

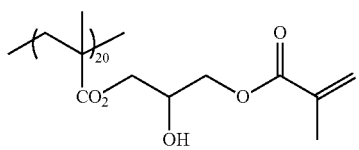

(9)

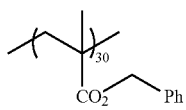 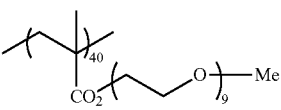

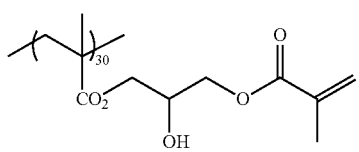

(10)

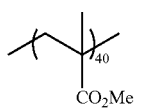 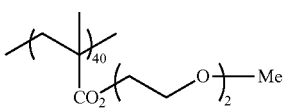

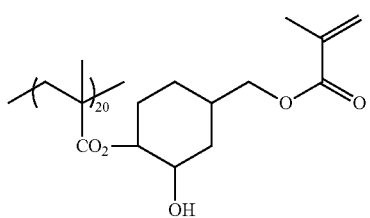

(11)

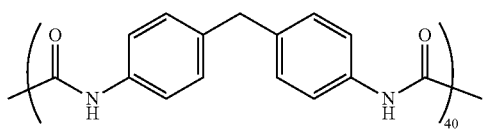

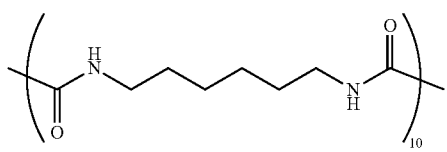

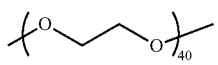

(8)

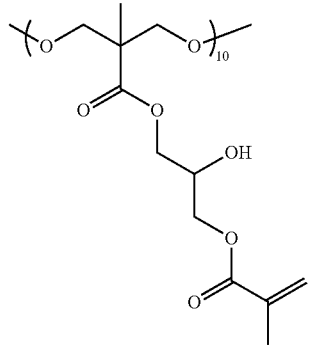

The weight average molecular weight (Mw) of the binder polymer according to the invention is preferably 2,000 or more, more preferably 5,000 or more, and still more preferably from 10,000 to 300,000.

According to the invention, a hydrophilic polymer, for example, polyacrylic acid or polyvinyl alcohol described in JP-A-2008-195018 may be used, if desired. Further, an oleophilic binder polymer is used together with a hydrophilic binder polymer.

The content of the binder polymer is ordinarily from 5 to 90% by weight, preferably from 5 to 80% by weight, more preferably from 10 to 70% by weight, based on the total solid content of the image-recording layer.

(E) Polymer Fine Particle

In the invention, a polymer fine particle can be used in order to improve the on-press development property. In particular, a polymer fine particle having a polyalkylene oxide structure is preferred. A polymer fine particle having a polyalkylene oxide group in its side chain is particularly preferred. Due to the polymer fine particle, the permeability of dampening water increases to improve the on-press development property.

The polymer fine particle according to the invention is preferably a hydrophobizing precursor capable of converting the image-recording layer to be hydrophobic when heat is applied. The polymer fine particle of hydrophobizing precursor is preferably at least one fine particle selected from hydrophobic thermoplastic polymer fine particle, thermo-reactive polymer fine particle, microcapsule having a hydrophobic compound encapsulated therein and microgel (crosslinked polymer fine particle). Among them, polymer fine particle having a polymerizable group and microgel are preferred. In order to increase the on-press development property, it is preferred to have a polyalkylene oxide structure as described above.

As the hydrophobic thermoplastic polymer fine particle, hydrophobic thermoplastic polymer fine particles described, for example, in *Research Disclosure*, No. 333003, January (1992), JP-A-9-123387, JP-A-9-131850, JP-A-9-171249, JP-A-9-171250 and European Patent 931,647 are preferably exemplified.

Specific examples of the polymer constituting the polymer fine particle include a homopolymer or copolymer of a monomer, for example, ethylene, styrene, vinyl chloride, methyl acrylate, ethyl acrylate, methyl methacrylate, ethyl methacrylate, vinylidene chloride, acrylonitrile, vinyl carbazole or an acrylate or methacrylate having a polyalkylene structure and a mixture thereof. Among them, polystyrene, a copolymer containing styrene and acrylonitrile and polymethyl methacrylate are more preferred.

The average particle size of the hydrophobic thermoplastic polymer fine particle for use in the invention is preferably from 0.01 to 2.0 μm.

The thermo-reactive polymer fine particle for use in the invention includes polymer fine particle having a thermo-reactive group and forms a hydrophobized region by crosslinkage due to thermal reaction and change in the functional group involved therein.

As the thermo-reactive group of the polymer fine particle having a thermo-reactive group for use in the invention, although a functional group performing any reaction can be used as long as a chemical bond is formed. For instance, an ethylenically unsaturated group (for example, an acryloyl group, a methacryloyl group, a vinyl group or an allyl group) performing a radical polymerization reaction, a cationic polymerizable group (for example, a vinyl group or a vinyloxy group), an isocyanate group performing an addition reaction or a blocked form thereof, an epoxy group, a vinyloxy group and a functional group having an active hydrogen atom (for example, an amino group, a hydroxy group or a carboxyl group) as the reaction partner thereof, a carboxyl group performing a condensation reaction and a hydroxyl group or an amino group as the reaction partner thereof, and an acid anhydride performing a ring opening addition reaction and an amino group or a hydroxyl group as the reaction partner thereof are preferably exemplified.

As the microcapsule for use in the invention, microcapsule having all or part of the constituting components of the image-recording layer encapsulated as described, for example, in JP-A-2001-277740 and JP-A-2001-277742 is exemplified. The constituting components of the image-recording layer may be present outside the microcapsules. It is a more preferred embodiment of the image-recording layer containing microcapsules that the hydrophobic constituting components are encapsulated in microcapsules and the hydrophilic components are present outside the microcapsules.

According to the invention, an embodiment containing a crosslinked resin particle, that is, a microgel may be used. The microgel can contain a part of the constituting components of the image-recording layer in the inside and/or on the surface thereof. In particular, an embodiment of a reactive microgel containing a radical polymerizable compound (C) on the surface thereof is preferred in view of the image-forming sensitivity and printing durability.

In order to conduct microencapsulation or microgelation of the constituting component of the image-recording layer, known methods can be used.

The average particle size of the microcapsule or microgel is preferably from 0.01 to 3.0 μm, more preferably from 0.05 to 2.0 μm, particularly preferably from 0.10 to 1.0 μm. In the range described above, good resolution and good time lapse stability can be achieved.

The content of the polymer fine particle is preferably in a range from 5 to 90% by weight based on the total solid content of the image-recording layer.

(F) Oil-Sensitizing Agent

In order to improve the ink receptivity, an oil-sensitizing agent, for example, a phosphonium compound, a nitrogen-containing low molecular weight compound or an ammonium group-containing polymer can be used in the image-recording layer. In particular, in the case where an inorganic stratiform compound is incorporated into an oxygen-blocking layer, the oil-sensitizing agent functions as a surface covering agent of the inorganic stratiform compound and prevents deterioration of the ink receptivity during printing due to the inorganic stratiform compound.

As preferred examples of the phosphonium compound, phosphonium compounds described in JP-A-2006-297907 and JP-A-2007-50660 are exemplified. Specific examples of the phosphonium compound include tetrabutylphosphonium iodide, butyltriphenylphosphonium bromide, tetraphenylphosphonium bromide, 1,4-bis(triphenylphosphonio)butane di(hexafluorophosphate), 1,7-bis(triphenylphosphonio)heptane sulfate, 1,9-bis(triphenylphosphonio)nonane naphthalene-2,7-disulfonate and 1,9-bis(triphenylphosphonio)nonane di(hexafluorophosphate).

As the nitrogen-containing low molecular weight compound, an amine salt and a quaternary ammonium salt are exemplified. Also, an imidazolinium salt, a benzimidazolinium salt, a pyridinium salt and a quinolinium salt are exemplified. Of the nitrogen-containing low molecular weight compounds, the quaternary ammonium salt and pyridinium salt are preferably used. Specific examples the nitrogen-containing low molecular weight compound include tetramethylammonium hexafluorophosphate, tetrabutylammonium hexafluorophosphate, dodecyltrimethylammonium p-toluenesulfonate, benzyltriethylammonium hexafluorophosphate, benzyldimethyloctylammonium hexafluorophosphate and benzyldimethyldodecylammonium hexafluorophosphate.

The ammonium group-containing polymer may be any polymer containing an ammonium group in its structure and is preferably a polymer containing from 5 to 80% by mole of (meth)acrylate having an ammonium group in its side chain as a copolymerization component.

As to the ammonium salt-containing polymer, its reduced specific viscosity value (unit: cSt/g/ml) determined according to the measuring method described below is preferably from 5 to 120, more preferably from 10 to 110, and particularly preferably from 15 to 100.

<Measuring Method of Reduced Specific Viscosity>

In a 20 ml measuring flask was weighed 1 g of polymer solid content and the measuring flask is filled up to the gauge line with N-methylpyrrolidone. The resulting solution was put into an Ubbelohde viscometer (viscometer constant: 0.010 cSt/s) and a period for running down of the solution at 30° C. was measured, and the reduced specific viscosity was calculated according to a conventional method using a calculation formula: Kinetic viscosity=Viscometer constant×Period for running down of solution (sec).

Specific examples of the ammonium group-containing polymer are set forth below.

(1) 2-(Trimethylammonio)ethyl methacrylate p-toluenesulfonate/3,6-dioxaheptyl methacrylate copolymer (molar ratio: 10/90)

(2) 2-(Trimethylammonio)ethyl methacrylate hexafluorophosphate/3,6-dioxaheptyl methacrylate copolymer (molar ratio: 20/80)

(3) 2-(Ethyldimethylammonio)ethyl methacrylate p-toluenesulfonate/hexyl methacrylate copolymer (molar ratio: 30/70)

(4) 2-(Trimethylammonio)ethyl methacrylate hexafluorophosphate/2-ethylhexyl methacrylate copolymer (molar ratio: 20/80)

(5) 2-(Trimethylammonio)ethyl methacrylate methylsulfate/hexyl methacrylate copolymer (molar ratio: 40/60)

(6) 2-(Butyldimethylammonio)ethyl methacrylate hexafluorophosphate/3,6-dioxaheptyl methacrylate copolymer (molar ratio: 20/80)

(7) 2-(Butyldimethylammonio)ethyl acrylate hexafluorophosphate/3,6-dioxaheptyl methacrylate copolymer (molar ratio: 20/80)

(8) 2-(Butyldimethylammonio)ethyl methacrylate 13-ethyl-5,8,11-trioxa-1-heptadecanesulfonate/3,6-dioxaheptyl methacrylate copolymer (molar ratio: 20/80)

(9) 2-(Butyldimethylammonio)ethyl methacrylate hexafluorophosphate/3,6-dioxaheptyl methacrylate/2-hydroxy-3-methacryloyloxypropyl methacrylate copolymer (molar ratio: 15/80/5)

The content of the oil-sensitizing agent is preferably from 0.01 to 30.0% by weight, more preferably from 0.1 to 15.0% by weight, still more preferably from 1 to 10% by weight, based on the total solid content of the image-recording layer.

(G) Other Components

Other components, for example, a surfactant, a coloring agent, a print-out agent, a polymerization inhibitor, a higher fatty acid derivative, a plasticizer, a fine inorganic particle, an inorganic stratiform compound, a co-sensitizer or a chain transfer agent may further be added to the image-recording layer. Specifically, compounds and amounts added thereof described, for example, in Paragraph Nos. [0114] to [0159] of JP-A-2008-284817, Paragraph Nos. [0023] to [0027] of JP-A-2006-91479 and Paragraph No. [0060] of U.S. Patent Publication No. 2008/0311520 are preferably used.

(H) Formation of Image-Recording Layer

The image-recording layer according to the invention is formed by dispersing or dissolving each of the necessary components described above in a known solvent to prepare a coating solution and coating the solution on a support by a known method, for example, bar coater coating and drying as described, for example, in Paragraph Nos. [0142] to [0143] of JP-A-2008-195018. The coating amount (solid content) of the image-recording layer formed on the support after coating and drying may be varied according to the intended purpose but is in general preferably from 0.3 to 3.0 g/m$^2$. In the range described above, good sensitivity and good film property of the image-recording layer can be achieved.

[Intermediate Layer]

In the lithographic printing plate precursor according to the invention, it is preferred to provide an intermediate layer between the image-recording layer and the support. The intermediate layer strengthens adhesion between the support and the image-recording layer in the exposed area and makes removal of the image-recording layer from the support in the unexposed area easy, thereby contributing improvement in the development property without accompanying degradation of the printing durability. Further, in the case of infrared laser exposure, since the intermediate layer acts as a heat insulating layer, decrease in sensitivity due to diffusion of heat generated upon the exposure into the support is prevented.

In the intermediate layer, the specific polymer compound described above is used. The specific low molecular weight compound is also used as described above. In addition to the specific compound, the intermediate layer according to the invention may contain a chelating agent, a secondary or tertiary amine, a polymerization inhibitor or a compound containing an amino group or a functional group having polymerization inhibition ability and a group capable of interacting with a surface of aluminum support (for example, 1,4-diazabicyclo[2,2,2]octane (DABCO), 2,3,5,6-tetrahydroxy-p-quinone, chloranil, sulfophthalic acid, hydroxyethylethylenediaminetriacetic acid, dihydroxyethylethylenediaminediacetic acid or hydroxyethyliminodiacetic acid) in order to prevent the occurrence of stain due to the lapse of time.

The intermediate layer is coated according to a known method. The coating amount (solid content) of the intermediate layer is preferably from 1.1 to 350 mg/m$^2$, and more preferably from 2.0 to 100 mg/m$^2$.

[Overcoat Layer]

In the lithographic printing plate precursor according to the invention, it is preferred to provide an overcoat layer (also referred to as a protective layer) on the image-recording layer. The overcoat layer has a function for preventing, for example, occurrence of scratch in the image-recording layer or ablation caused by exposure with high illuminance laser, in addition to the function for restraining an inhibition reaction against the image formation by means of oxygen blocking.

With respect to the overcoat layer having such properties, there are described, for example, in U.S. Pat. No. 3,458,311 and JP-B-55-49729. As a polymer having low oxygen permeability for use in the overcoat layer, any water-soluble polymer and water-insoluble polymer can be appropriately selected to use. The polymers may be used in mixture of two or more thereof, if desired. Specifically, for example, polyvinyl alcohol, a modified polyvinyl alcohol, polyvinyl pyrrolidone, a water-soluble cellulose derivative and poly (meth)acrylonitrile are exemplified.

As the modified polyvinyl alcohol, an acid-modified polyvinyl alcohol having a carboxylic acid group or a sulfonic acid group is preferably used. Specifically, modified polyvinyl alcohols described in JP-A-2005-250216 and JP-A-2006-259137 are preferably exemplified.

As a preferred embodiment of the overcoat layer, an overcoat layer containing an inorganic stratiform compound described, for example, in JP-A-11-38633 is exemplified. By a combination of the inorganic stratiform compound and the binder, good oxygen-blocking property can be obtained. The inorganic stratiform compound which can be used in the invention is a particle having a thin tabular shape and includes, for instance, a mica, for example, natural mica represented by

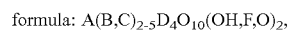

formula: A(B,C)$_{2-5}$D$_4$O$_{10}$(OH,F,O)$_2$, (wherein A represents any of K, Na and Ca, B and C each represents any of Fe (II), Fe(III), Mn, Al, Mg and V, and D represents Si or Al) or synthetic mica, talc represented by formula: 3MgO.4SiO.H$_2$O, taeniolite, montmorillonite, saponite, hectorite and zirconium phosphate.

As the natural mica, specifically, muscovite, paragonite, phlogopite, biotite and lepidolite are exemplified.

Also, as the synthetic mica, specifically, non-swellable mica, for example, fluorphlogopite KMg$_3$(AlSi$_3$O$_{10}$)F$_2$ or potassium tetrasilic mica KMg$_{2.5}$(Si$_4$O$_{10}$)F$_2$, and swellable mica, for example, Na tetrasilic mica NaMg$_{2.5}$(Si$_4$O$_{10}$)F$_2$, Na or Li teniolite (Na,Li)Mg$_2$Li(Si$_4$O$_{10}$)F$_2$, or montmorillonite-based Na or Li hectorite (Na,Li)$_{1/8}$Mg$_{2/5}$Li$_{1/8}$(Si$_4$O$_{10}$)F$_2$ are exemplified. Further, synthetic smectite is also useful.

In the invention, of the inorganic stratiform compounds, fluorine-based swellable mica, which is a synthetic inorganic stratiform compound, is particularly useful.

As to the shape of the inorganic stratiform compound for use in the invention, from the standpoint of control of diffusion, the thickness is preferably smaller and as long as the smoothness of the coated surface and the transmission of actinic radiation are not damaged, the plane size is preferably larger. Therefore, an aspect ratio is preferably 20 or more, more preferably 100 or more, and particularly preferably 200 or more. The aspect ratio is a ratio of thickness to major axis of particle and can be determined, for example, from a projection drawing of particle by a microphotography. As the aspect ratio is larger, the effect obtained is higher.

As to a particle diameter of the inorganic stratiform compound for use in the invention, an average major axis is preferably from 0.3 to 20 µm, more preferably from 0.5 to 10 µm, and particularly preferably from 1 to 5 µm. Also, an average thickness of the particle is preferably 0.1 µm or less, more preferably 0.05 µm or less, and particularly preferably 0.01 µm or less. For example, with respect to the swellable synthetic mica that is the representative compound of the inorganic stratiform compound, the thickness is approximately from 1 to 50 nm and the plain size is approximately from 1 to 20 µm.

When such an inorganic stratiform compound particle having a large aspect ratio is incorporated into the overcoat layer, strength of the coated layer increases and penetration of oxygen or moisture can be effectively inhibited and thus, the overcoat layer can be prevented from deterioration due to deformation.

The content of the inorganic stratiform compound in the overcoat layer is preferably from 5 to 55% by weight, more preferably from 10 to 40% by weight, based on the total solid content of the overcoat layer. When the content is 5% by weight or more, the effect for antiadhesion property is recognized, whereas when the content is 55% by weight or less, a film-forming property is good and a sufficient sensitivity is obtained. When a plurality of inorganic stratiform compounds is used in combination, it is also preferred that the total amount of the inorganic stratiform compounds falls within the range of weight percentage described above.

Dispersion of the inorganic stratiform compound for use in the overcoat layer is performed, for example, in the manner described below. Specifically, from 5 to 10 parts by weight of a swellable inorganic stratiform compound that is exemplified as a preferred example of the inorganic stratiform compound is added to 100 parts by weight of water to sufficiently adapt the compound to water and to be swollen, followed by dispersing using a dispersing machine.

The dispersing machine used includes, for example, a variety of mills conducting dispersion by directly applying mechanical power, a high-speed agitation type dispersing machine providing a large shear force and a dispersion machine providing ultrasonic energy of high intensity. Specific examples of the dispersing machine include a ball mill, a sand grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having a Polman whistle. The dispersion containing from 5 to 10% by weight of the inorganic stratiform compound dispersed by the method described above is highly viscous or gelled and exhibits extremely good preservation stability. In the preparation of a coating solution for overcoat layer using the dispersion, it is preferred that the dispersion is diluted with water, thoroughly stirred and then mixed with a binder solution.

Also, the overcoat layer may contain known additives, for example, a plasticizer for imparting flexibility, a surfactant for improving coating property or an inorganic fine particle for controlling a surface slipping property. Further, the oil-sensitizing agent described with respect to the image-recording layer may also be incorporated into the overcoat layer.

The overcoat layer can be coated by a known method. The coating amount of the overcoat layer is preferably in a range from 0.01 to 10 g/m², more preferably in a range from 0.02 to 3 g/m², most preferably in a range from 0.02 to 1 g/m², in terms of the coating amount after drying.

[Support]
As the support for use in the lithographic printing plate precursor according to the invention, a known support is employed. Of the supports, an aluminum plate subjected to roughening treatment and anodizing treatment according to a known method is preferred. Also, an aluminum plate having a low content of iron described in JP-A-2009-255434 is preferably exemplified.

Also, an enlarging treatment or a sealing treatment of micropores of the anodized film described in JP-A-2001-253181 and JP-A-2001-322365 or a surface hydrophilizing treatment, for example, with an alkali metal silicate as described in U.S. Pat. Nos. 2,714,066, 3,181,461, 3,280,734 and 3,902,734 or polyvinyl phosphonic acid as described in U.S. Pat. Nos. 3,276,868, 4,153,461 and 4,689,272 may be appropriately selected and applied to the aluminum plate, if desired.

The support preferably has a center line average roughness of 0.10 to 1.2 µm.

The support may have a backcoat layer containing an organic polymer compound described in JP-A-5-45885 or an alkoxy compound of silicon described in JP-A-6-35174, provided on the back surface thereof, if desired.

[Plate Making Method]
Plate making of the lithographic printing plate precursor according to the invention is preferably performed by an on-press development method. The on-press development method includes a step in which the lithographic printing plate precursor is imagewise exposed and a printing step in which oily ink and an aqueous component are supplied to the exposed lithographic printing plate precursor without undergoing any development processing to perform printing, and it is characterized in that the unexposed area of the lithographic printing plate precursor is removed in the course of the printing step. The imagewise exposure may be performed on a printing machine after the lithographic printing plate precursor is mounted on the printing machine or may be separately performed using a platesetter or the like. In the latter case, the exposed lithographic printing plate precursor is mounted as it is on a printing machine without undergoing a development processing step. Then, the printing operation is initiated using the printing machine with supplying oily ink and an aqueous component and at an early stage of the printing the on-press development is carried out. Specifically, the image-recording layer in the unexposed area is removed and the hydrophilic surface of support is revealed therewith to form the non-image area. As the oily ink and aqueous component, printing ink and dampening water for conventional lithographic printing can be employed, respectively.

The plate making method is described in more detail below.

As the light source used for the image exposure in the invention, laser is preferred. The laser for use in the invention is not particularly restricted and, for example, a solid laser or semiconductor laser emitting an infrared ray having a wavelength from 760 to 1,200 nm is preferably exemplified.

With respect to the infrared ray laser, the output is preferably 100 mW or more, the exposure time per pixel is preferably within 20 microseconds, and the irradiation energy is preferably from 10 to 300 mJ/cm². With respect to the laser exposure, in order to reduce the exposure time, it is preferred to use a multibeam laser device.

The exposed lithographic printing plate precursor is mounted on a plate cylinder of a printing machine. In case of using a printing machine equipped with a laser exposure apparatus, the lithographic printing plate precursor is mounted on a plate cylinder of the printing machine and then subjected to the imagewise exposure.

When dampening water and printing ink are supplied to the imagewise exposed lithographic printing plate precursor to perform printing, in the exposed area of the image-recording layer, the image-recording layer cured by the exposure forms the printing ink receptive area having the oleophilic surface. On the other hand, in the unexposed area, the uncured image-recording layer is removed by dissolution or dispersion with the dampening water and/or printing ink supplied to reveal the hydrophilic surface in the area. As a result, the dampening water adheres onto the revealed hydrophilic surface and the printing ink adheres onto the exposed area of the image-recording layer, whereby printing is initiated.

While either the dampening water or printing ink may be supplied at first on the surface of lithographic printing plate precursor, it is preferred to supply the dampening water at first from the standpoint that the printing ink does not inhibit penetration of the dampening water into the uncured image-recording layer.

Thus, the lithographic printing plate precursor according to the invention is subjected to the on-press development on an offset printing machine and used as it is for printing a large number of sheets.

EXAMPLES

The present invention will be described in more detail with reference to the following examples, but the invention should not be construed as being limited thereto. With respect to the polymer compounds used in the examples, unless otherwise particularly defined, a molecular weight means a weight average molecular weight (Mw) and a ratio of repeating unit is indicated in mole percent.

Examples 1 to 33 and Comparative Examples 1 to 11

(1) Preparation of Support

An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight nitric acid at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current, and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

Then, the plate was further subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying.

The plate was then subjected to an anodizing treatment using as an electrolytic solution, a 15% by weight aqueous sulfuric acid solution (containing 0.5% by weight of aluminum ion) at a current density of 15 A/dm$^2$ to form a direct current anodized film of 2.5 g/m$^2$, washed with water and dried to prepare Support (1).

Thereafter, in order to ensure the hydrophilicity of the non-image area, Support (1) was subjected to silicate treatment using a 2.5% by weight aqueous sodium silicate No. 3 solution at 60° C. for 10 seconds and then was washed with water to obtain Support (2). The adhesion amount of Si was 10 mg/m$^2$. The center line average roughness (Ra) of the support was measured using a stylus having a diameter of 2 μm and found to be 0.51 μm.

(2) Formation of Intermediate Layer

Coating solution (1) for intermediate layer shown below was coated on Support (2) described above so as to have a dry coating amount of 20 mg/m$^2$ to prepare a support having an intermediate layer.

<Coating Solution (1) for Intermediate Layer>

| | |
|---|---|
| Specific polymer compound or comparative polymer compound shown in Table 1 | 0.50 g |
| Specific low molecular weight compound shown in Table 1 | 0.50 g |
| Water | 500.0 g |

Comparative Compound for Specific Polymer Compound

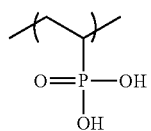

Mw 200,000

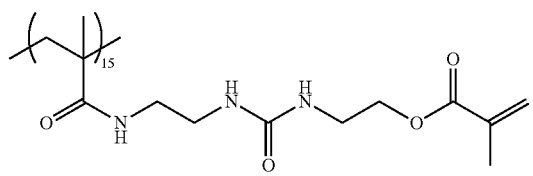

-continued

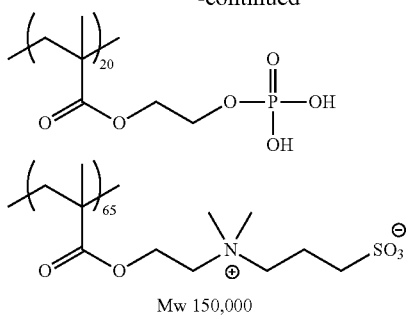

Mw 150,000

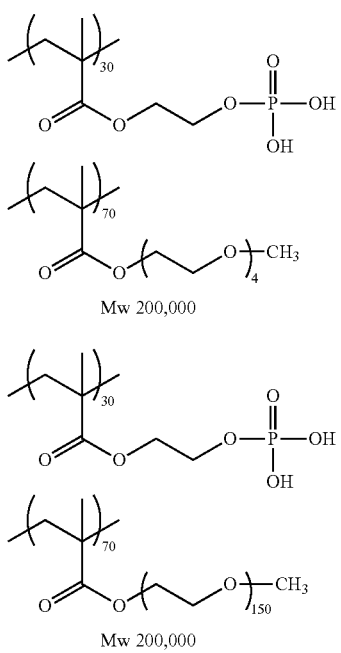

Mw 200,000

Mw 200,000

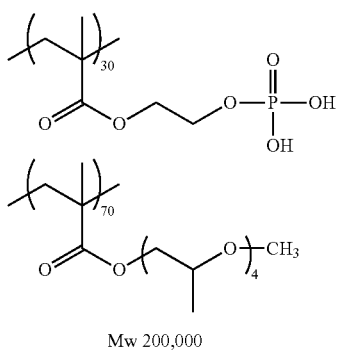

Mw 200,000

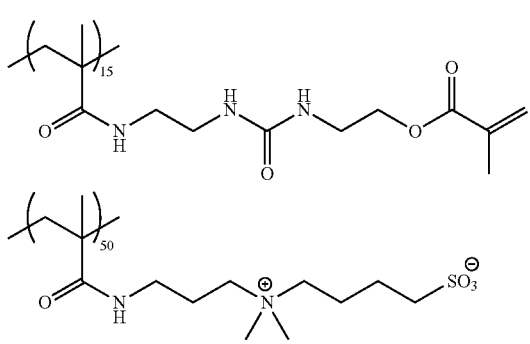

R3

R4

R5

R6

-continued

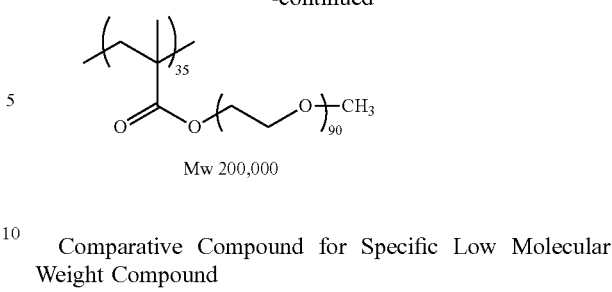

Mw 200,000

Comparative Compound for Specific Low Molecular Weight Compound

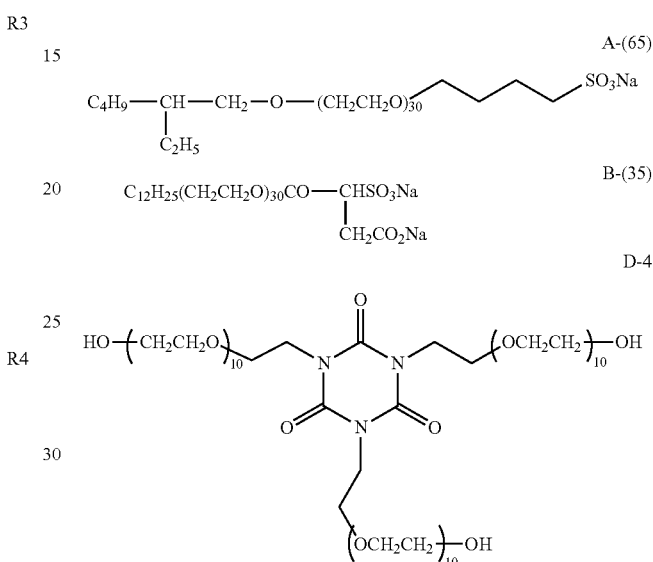

(3) Formation of Image-Recording Layer

Coating solution (1) for image-recording layer having the composition shown below was coated on the intermediate layer formed as described above by a bar and dried in an oven at 100° C. for 60 seconds to form an image-recording layer having a dry coating amount of 1.0 g/m².

Coating solution (1) for image-recording layer was prepared by mixing Photosensitive solution (1) shown below with Microgel solution (1) shown below just before the coating, followed by stirring.

<Photosensitive Solution (1)>

| | |
|---|---|
| Binder polymer (1) having structure shown below | 0.240 g |
| Infrared absorbing dye (1) having structure shown below | 0.030 g |
| Polymerization initiator (1) having structure shown below | 0.162 g |
| Radical polymerizable compound (Tris(acryloyloxyethyl) isocyanurate (NK ESTER A-9300, produced by Shin-Nakamura Chemical Co., Ltd.)) | 0.192 g |
| Tris(2-hydroxyethyl) isocyanurate | 0.062 g |
| Specific low molecular weight compound shown in Table 1 (when specific low molecular weight compound was also added to intermediate layer, amount was 0.025 g) | 0.050 g |
| Oil-sensitizing agent (Phosphonium compound (1) having structure shown below) | 0.055 g |
| Oil-sensitizing agent (Benzyl dimethyl octyl ammonium PF$_6$ salt) | 0.018 g |
| Oil-sensitizing agent (Ammonium group-containing polymer having structure shown below (reduced specific viscosity: 44 cSt/g/ml) | 0.035 g |

-continued

| | |
|---|---|
| Fluorine-based surfactant (1) having structure shown below | 0.008 g |
| 2-Butanone | 1.091 g |
| 1-Methoxy-2-propanol | 8.609 g |

<Microgel Solution (1)>

| | |
|---|---|
| Microgel (1) | 2.640 g |
| Distilled water | 2.425 g |

The structures of Binder polymer (1), Infrared absorbing dye (1), Polymerization initiator (1), Phosphonium compound (1), Ammonium group-containing polymer and Fluorine-based surfactant (1) are shown below.

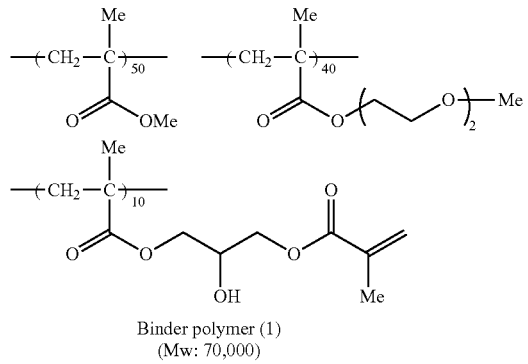

Binder polymer (1)
(Mw: 70,000)

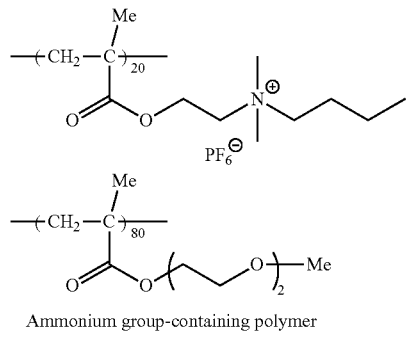

Ammonium group-containing polymer

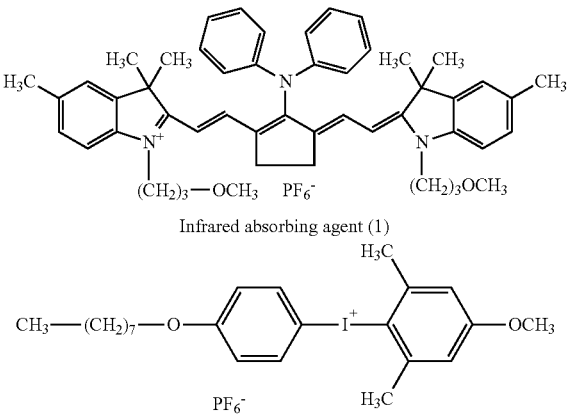

Infrared absorbing agent (1)

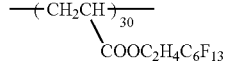

Polymerization initiator (1)

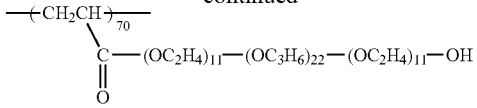

(Mw: 13,000)
Fluorine-based surfactant (1)

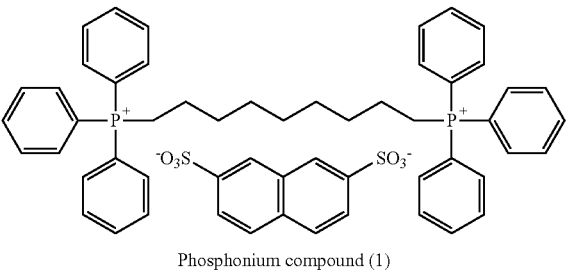

Phosphonium compound (1)

<Preparation of Microgel (1)>

An oil phase component was prepared by dissolving 4.46 g of polyfunctional isocyanate having the structure shown below (produced by Mitsui Chemicals, Inc., 75% by weight ethyl acetate solution), 10 g of an adduct obtained by addition of trimethylolpropane (6 mol) and xylene diisocyanate (18 mol) and further addition of methyl-terminated polyoxyethylene (1 mol) (number of oxyethylene repeating unit: 90) (produced by Mitsui Chemicals Polyurethanes, Inc., 50% by weight ethyl acetate solution), 3.15 g of pentaerythritol triacrylate (SR444, produced by Nippon Kayaku Co., Ltd.) and 0.1 g of PIONIN A-41C (produced by Takemoto Oil & Fat Co., Ltd.) in 17 g of ethyl acetate. As an aqueous phase component, 40 g of a 4% by weight aqueous solution of polyvinyl alcohol (PVA-205, produced by Kuraray Co., Ltd.) was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid content concentration of 15% by weight to prepare Microgel (1). The average particle size of the microgel was measured by a light scattering method and found to be 0.2 μm.

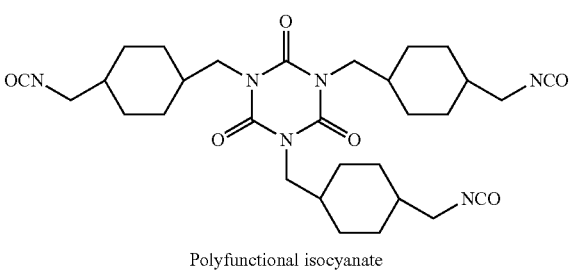

Polyfunctional isocyanate (4) Formation of Overcoat Layer

Coating solution (1) for overcoat layer having the composition shown below was coated on the image-recording layer described above by a bar and dried in an oven at 120° C. for 60 seconds to form a protective layer having a dry coating amount of 0.15 g/m², thereby preparing the lithographic printing plate precursors for Examples 1 to 33 and Comparative Examples 1 to 11, respectively.

<Coating Solution (1) for Overcoat Layer>

| | |
|---|---|
| Dispersion of inorganic stratiform compound (1) | 1.5 g |
| Aqueous 6% by weight solution of polyvinyl alcohol (CKS 50, sulfonic acid-modified, saponification degree: 99% by mole or more, polymerization degree: 300, produced by Nippon Synthetic Chemical Industry Co., Ltd.) | 0.55 g |
| Aqueous 6% by weight solution of polyvinyl alcohol (PVA-405, saponification degree: 81.5% by mole, polymerization degree: 500, produced by Kuraray Co., Ltd.) | 0.03 g |
| Aqueous 1% by weight solution of surfactant (EMALEX 710, produced by Nihon Emulsion Co., Ltd.) | 0.86 g |
| Ion-exchanged water | 6.0 g |

<Preparation of Dispersion of Inorganic Stratiform Compound (1)>

To 193.6 g of ion-exchanged water was added 6.4 g of synthetic mica (SOMASIF ME-100, produced by CO-OP Chemical Co., Ltd.) and the mixture was dispersed using a homogenizer until an average particle size (according to a laser scattering method) became 3 µm to prepare Dispersion of inorganic stratiform compound (1). The aspect ratio of the inorganic particle thus-dispersed was 100 or more.

(5) Evaluation of Lithographic Printing Plate Precursor

Each of the lithographic printing plate precursors thus-obtained was exposed by LUXEL PLATESETTER T-60001II equipped with an infrared semiconductor laser, produced by FUJIFILM Corp. under the conditions of a rotational number of an external drum of 1,000 rpm, laser output of 70% and resolution of 2,400 dpi. The exposed image contained a solid image and a 50% halftone dot chart of a 20 µm-dot FM screen.

The exposed lithographic printing plate precursor was mounted without undergoing development processing on a plate cylinder of a printing machine (LITHRONE 26, produced by Komori Corp.). Using dampening water (ECOLITY-2 (produced by FUJIFILM Corp.)/tap water=2/98 (volume ratio)) and SPACE COLOR FUSION G (N) ink (produced by DIC Graphics Corp.), the dampening water and ink were supplied according to the standard automatic printing start method of LITHRONE 26 to conduct printing on 100 sheets of TOKUBISHI art paper (76.5 kg) at a printing speed of 10,000 sheets per hour.

<On-Press Development Property>

A number of the printing papers required until the on-press development of the unexposed area of the image-recording layer on the printing machine was completed to reach a state where the ink was not transferred to the printing paper in the non-image area was measured to evaluate the on-press development property. The results obtained are shown in Table 1.

<On-Press Development Property after Passage of Time>

The lithographic printing plate precursor prepared and interleaf were subjected to humidity conditioning at 25° C. and 70% RH for one hour. The interleaf was placed on the lithographic printing plate precursor conditioned to from a set and 30 sets thereof was piled to prepare a stack. The stack was sandwiched top and bottom with backing cardboards and wrapped with aluminum kraft paper to prepare a package of ordinary product form. The package was stored at 60° C. for 4.5 days to obtain a lithographic printing plate precursor which was subjected to simulation of long-term storage. Using the lithographic printing plate precursor, the on-press development property was determined in the same manner as described above. The results obtained are shown in Table 1.

<Printing Durability>

After performing the evaluation for the on-press development property of the lithographic printing plate precursor without the storage described above, the printing was continued. As the increase in a number of printing papers, the image-recording layer was gradually abraded to cause decrease in the ink density on the printing paper. A number of printing papers wherein a value obtained by measuring a halftone dot area rate of the 50% halftone dot of FM screen on the printing paper using a Gretag densitometer decreased by 5% from the value measured on the 100th paper of the printing was determined to evaluate the printing durability. The results obtained are shown in Table 1.

TABLE 1

| | Intermediate Layer | | Image-recording Layer | On-press Development Property | | Printing Durability (×10⁴ sheets) |
|---|---|---|---|---|---|---|
| | Specific Polymer Compound | Specific Low Molecular Weight Compound | Specific Low Molecular Weight Compound | Before Storage (sheets) | After Storage (sheets) | |
| | | | Examples 1 to 21 | | | |
| Example 1 | (1) | None | A-(34) | 25 | 45 | 3 |
| Example 2 | (2) | None | A-(34) | 25 | 40 | 3 |
| Example 3 | (3) | None | A-(34) | 25 | 35 | 3 |
| Example 4 | (4) | None | A-(34) | 25 | 30 | 3 |
| Example 5 | (5) | None | A-(34) | 25 | 30 | 3 |
| Example 6 | (6) | None | A-(34) | 25 | 35 | 3 |

TABLE 1-continued

|  | Intermediate Layer | | Image-recording Layer | On-press Development Property | | |
|---|---|---|---|---|---|---|
|  | Specific Polymer Compound | Specific Low Molecular Weight Compound | Specific Low Molecular Weight Compound | Before Storage (sheets) | After Storage (sheets) | Printing Durability ($\times 10^4$ sheets) |
| Example 7 | (7) | None | A-(34) | 25 | 45 | 3 |
| Example 8 | (8) | None | A-(34) | 30 | 35 | 3 |
| Example 9 | (5) | A-(34) | None | 25 | 30 | 3 |
| Example 10 | (5) | A-(34) | A-(34) | 25 | 30 | 3 |
| Example 11 | (9) | None | A-(34) | 25 | 35 | 4.5 |
| Example 12 | (29) | None | A-(34) | 25 | 40 | 4 |
| Example 13 | (10) | None | A-(34) | 25 | 35 | 4 |
| Example 14 | (10) | None | A-(46) | 25 | 45 | 4 |
| Example 15 | (10) | None | A-(33) | 25 | 35 | 4 |
| Example 16 | (10) | None | A-(36) | 25 | 35 | 4 |
| Example 17 | (10) | None | A-(57) | 25 | 35 | 4 |
| Example 18 | (10) | None | A-(58) | 25 | 35 | 3.75 |
| Example 19 | (10) | None | A-(60) | 30 | 50 | 4 |
| Example 20 | (10) | None | A-(61) | 30 | 50 | 4 |
| Example 21 | (10) | None | A-(59) | 25 | 35 | 3.75 |
| Examples 22 to 33 and Comparative Examples 1 to 11 | | | | | | |
| Example 22 | (10) | None | B-(29) | 30 | 50 | 4 |
| Example 23 | (10) | None | B-(30) | 30 | 45 | 4 |
| Example 24 | (10) | None | B-(31) | 30 | 45 | 4 |
| Example 25 | (10) | None | B-(32) | 30 | 45 | 4 |
| Example 26 | (10) | None | B-(33) | 30 | 40 | 3.75 |
| Example 27 | (10) | None | A-(62) | 30 | 40 | 4 |
| Example 28 | (10) | None | B-(34) | 35 | 45 | 4 |
| Example 29 | (10) | None | D-(1) | 40 | 55 | 4.25 |
| Example 30 | (10) | None | D-(2) | 35 | 55 | 4.25 |
| Example 31 | (10) | None | D-(3) | 35 | 55 | 4.25 |
| Example 32 | (10) | None | C-(1) | 35 | 50 | 3 |
| Example 33 | (10) | None | D-(5) | 35 | 50 | 3 |
| Comparative Example 1 | R1 | None | A-(34) | 25 | 2,500 | — |
| Comparative Example 2 | R2 | None | A-(34) | 25 | 2,500 | — |
| Comparative Example 3 | (10) | None | None | 30 | 3,000 | — |
| Comparative Example 4 | (10) | None | Dodecylbenzenesulfonic Acid | 25 | 300 | 4 |
| Comparative Example 5 | (10) | None | A-(65) | 25 | 40 | 2.25 |
| Comparative Example 6 | (10) | None | B-(35) | 30 | 45 | 2.25 |
| Comparative Example 7 | (10) | None | D-(4) | 30 | 55 | 2.25 |
| Comparative Example 8 | R3 | None | A-(34) | 25 | 100 | 3 |
| Comparative Example 9 | R4 | None | A-(34) | 25 | 50 | 2.25 |
| Comparative Example 10 | R5 | None | A-(34) | 25 | 80 | 3.25 |
| Comparative Example 11 | R6 | None | A-(34) | No image formed | No image formed | No image formed |

Examples 41 to 73 and Comparative Examples 12 to 22

(1) Formation of Intermediate Layer

Coating solution (2) for intermediate layer shown below was coated on Support (2) described above so as to have a dry coating amount of 20 mg/m² to prepare a support having an intermediate layer.

<Coating Solution (2) for Intermediate Layer>

| | |
|---|---|
| Specific polymer compound or comparative polymer compound shown in Table 2 | 0.50 g |
| Specific low molecular weight compound shown in Table 2 | 0.50 g |
| Water | 500.0 g |

(2) Formation of Image-Recording Layer

Coating solution (2) for image-recording layer having the composition shown below was coated on the intermediate layer formed as described above by a bar and dried in an oven at 100° C. for 60 seconds to form an image-recording layer having a dry coating amount of 1.0 g/m², thereby preparing the lithographic printing plate precursors for Examples 41 to 73 and Comparative Examples 12 to 22, respectively.

<Coating Solution (2) for Image-Recording Layer>

| | |
|---|---|
| Aqueous dispersion (1) of polymer fine particle shown below | 20.0 g |
| Infrared absorbing agent (3) having structure shown below | 0.2 g |
| Specific low molecular weight compound shown in Table 2 (when specific low molecular compound was also added to intermediate layer, amount was 0.07 g) | 0.26 g |
| IRGACURE 250 | 0.5 g |
| Monomer having ethylenically unsaturated group (SR-399, produced by Sartomer Co.) | 1.50 g |
| Mercapto-3-triazole | 0.2 g |
| BYK 336 (produced by BYK-Chimie GmbH) | 0.4 g |
| KLUCEL M (produced by Hercules Chemical Co., Inc.) | 4.8 g |
| ELVACITE 4026 (produced by Ineos Acrylica Inc.) | 2.5 g |
| n-Propanol | 55.0 g |
| 2-Butanone | 17.0 g |

The compounds indicated using their trade names in the composition described above are shown below.

IRGACURE 250: (4-Methoxyphenyl)[4-(2-methylpropyl)phenyl]iodonium hexafluorophosphate (75% by weight propylene carbonate solution)

SR-399: Dipentaerythritol pentaacrylate

BYK 336: Modified dimethylpolysiloxane copolymer (25% by weight xylene/methoxypropyl acetate solution)

KLUCEL M: Hydroxypropyl cellulose (2% by weight aqueous solution)

ELVACITE 4026: Highly branched polymethyl methacrylate (10% by weight 2-butanone solution)

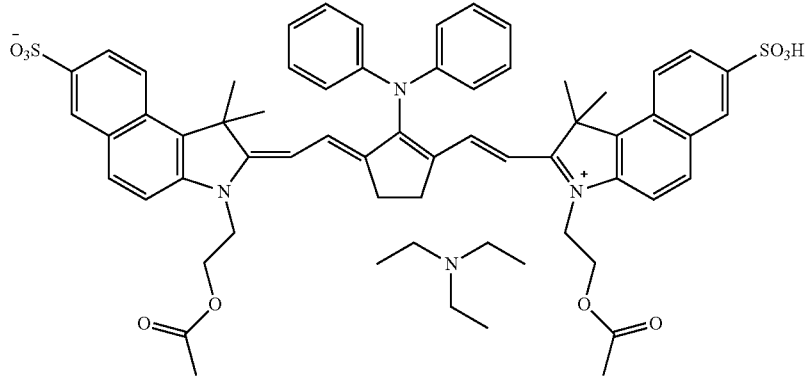

(3)

Infrared absorbing agent (Preparation of Aqueous Dispersion (1) of Polymer Fine Particle)

A stirrer, a thermometer, a dropping funnel, a nitrogen inlet tube and a reflux condenser were attached to a 1,000 ml four-neck flask and while carrying out deoxygenation by introduction of nitrogen gas, 10 g of polyethylene glycol methyl ether methacrylate (PEGMA, average repeating unit number of ethylene glycol: 50), 200 g of distilled water and 200 g of n-propanol were charged therein and heated until the internal temperature reached 70° C. Then, a mixture of 10 g of styrene (St), 80 g of acrylonitrile (AN) and 0.8 g of 2,2'-azobisisobutyronitrile previously prepared was dropwise added to the flask over a period of one hour. After the completion of the dropwise addition, the mixture was continued to react as it was for 5 hours. Then, 0.4 g of 2,2'-azobisisobutyronitrile was added and the internal temperature was raised to 80° C. Thereafter, 0.5 g of 2,2'-azobisisobutyronitrile was added over a period of 6 hours. At the stage after reacting for 20 hours in total, the polymerization proceeded 98% or more to obtain Aqueous dispersion (1) of polymer fine particle of PEGMA/St/AN (Oct. 10, 1980 in a weight ratio). The particle size distribution of the polymer fine particle had the maximum value at the particle size of 150 nm.

The particle size distribution was determined by taking an electron microphotograph of the polymer fine particle, measuring particle sizes of 5,000 fine particles in total on the photograph, and dividing a range from the largest value of the particle size measured to 0 on a logarithmic scale into 50parts to obtain occurrence frequency of each particle size by plotting. With respect to the aspherical particle, a particle size of a spherical particle having a particle area equivalent to the particle area of the aspherical particle on the photograph was defined as the particle size.

(3) Evaluation of Lithographic Printing Plate Precursor

With the lithographic printing plate precursors for Examples 41 to 73 and Comparative Examples 12 to 22, the on-press development property, on-press development property after passage of time and printing durability were evaluated in the same manner as in Examples 1 to 33

The results obtained are shown in Table 2.

TABLE 2

| | Intermediate Layer | | Image-recording Layer | On-press Development Property | | |
|---|---|---|---|---|---|---|
| | Specific Polymer Compound | Specific Low Molecular Weight Compound | Specific Low Molecular Weight Compound | Before Storage (sheets) | After Storage (sheets) | Printing Durability ($\times 10^4$ sheets) |
| Examples 41 to 61 | | | | | | |
| Example 41 | (1) | None | A-(34) | 20 | 48 | 2.5 |
| Example 42 | (2) | None | A-(34) | 20 | 45 | 2.5 |
| Example 43 | (3) | None | A-(34) | 20 | 30 | 2.5 |
| Example 44 | (4) | None | A-(34) | 20 | 30 | 2.5 |
| Example 45 | (5) | None | A-(34) | 20 | 35 | 2.5 |
| Example 46 | (6) | None | A-(34) | 20 | 40 | 2.5 |
| Example 47 | (7) | None | A-(34) | 20 | 45 | 2.5 |
| Example 48 | (8) | None | A-(34) | 25 | 40 | 2.5 |
| Example 49 | (5) | A-(34) | None | 20 | 45 | 2.5 |
| Example 50 | (5) | A-(34) | A-(34) | 20 | 45 | 2.5 |
| Example 51 | (9) | None | A-(34) | 20 | 45 | 4 |
| Example 52 | (29) | None | A-(34) | 20 | 45 | 3.5 |
| Example 53 | (10) | None | A-(34) | 20 | 40 | 3.5 |
| Example 54 | (10) | None | A-(46) | 20 | 48 | 3.5 |
| Example 55 | (10) | None | A-(33) | 20 | 45 | 3.5 |
| Example 56 | (10) | None | A-(36) | 20 | 40 | 3.5 |
| Example 57 | (10) | None | A-(57) | 20 | 40 | 3.5 |
| Example 58 | (10) | None | A-(58) | 20 | 40 | 3 |
| Example 59 | (10) | None | A-(60) | 25 | 55 | 3.5 |
| Example 60 | (10) | None | A-(61) | 25 | 55 | 3.5 |
| Example 61 | (10) | None | A-(59) | 25 | 45 | 3.5 |
| Examples 62 to 73 and Comparative Examples 12 to 22 | | | | | | |
| Example 62 | (10) | None | B-(29) | 20 | 45 | 3.5 |
| Example 63 | (10) | None | B-(30) | 20 | 40 | 3.5 |
| Example 64 | (10) | None | B-(31) | 20 | 40 | 3.5 |
| Example 65 | (10) | None | B-(32) | 20 | 40 | 3.5 |
| Example 66 | (10) | None | B-(33) | 20 | 40 | 3.5 |
| Example 67 | (10) | None | A-(62) | 25 | 45 | 3.5 |
| Example 68 | (10) | None | B-(34) | 30 | 48 | 3.5 |
| Example 69 | (10) | None | D-(1) | 40 | 55 | 3.5 |
| Example 70 | (10) | None | D-(2) | 35 | 55 | 3.5 |
| Example 71 | (10) | None | D-(3) | 35 | 55 | 3.5 |

TABLE 2-continued

| | Intermediate Layer | | Image-recording Layer | On-press Development Property | | Printing Durability |
| | Specific Polymer Compound | Specific Low Molecular Weight Compound | Specific Low Molecular Weight Compound | Before Storage (sheets) | After Storage (sheets) | ($\times 10^4$ sheets) |
|---|---|---|---|---|---|---|
| Example 72 | (10) | None | C-(1) | 35 | 55 | 3.5 |
| Example 73 | (10) | None | D-(5) | 35 | 55 | 3 |
| Comparative Example 12 | R1 | None | A-(34) | 25 | 2,500 | — |
| Comparative Example 13 | R2 | None | A-(34) | 25 | 2,500 | — |
| Comparative Example 14 | (10) | None | None | 30 | 3,000 | — |
| Comparative Example 15 | (10) | None | Dodecylbenzenesulfonic Acid | 25 | 300 | 3.5 |
| Comparative Example 16 | (10) | None | A-(65) | 25 | 50 | 2 |
| Comparative Example 17 | (10) | None | B-(35) | 35 | 60 | 2 |
| Comparative Example 18 | (10) | None | D-(4) | 25 | 100 | 2 |
| Comparative Example 19 | R3 | None | A-(34) | 25 | 100 | 2.5 |
| Comparative Example 20 | R4 | None | A-(34) | 25 | 100 | 2 |
| Comparative Example 21 | R5 | None | A-(34) | 30 | 90 | 2.5 |
| Comparative Example 22 | R6 | None | A-(34) | No image formed | No image formed | No image formed |

INDUSTRIAL APPLICABILITY

According to the present invention, a lithographic printing plate precursor which is excellent in both the on-press development property and the printing durability and which is excellent particularly in the on-press development property after preservation for a long period of time, and a plate making method thereof can be provided.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on May 31, 2011 (Japanese Patent Application No. 2011-122627), and the contents thereof are incorporated herein by reference.

The invention claimed is:

1. A lithographic printing plate precursor comprising a polymerizable image-recording layer on a support, wherein the lithographic printing plate precursor comprises an intermediate layer containing a polymer compound including a repeating unit (a1) having a support-adsorbing group and a repeating unit (a2) having a polyoxyalkylene group having a repeating number of oxyalkylene units of from 8 to 120 between the support and the polymerizable image-recording layer, the precursor contains a compound having a molecular weight of 1,500 or less and having an oxyalkylene group in at least one of the intermediate layer and the polymerizable image-recording layer, and the repeating unit (a1) is a repeating unit having, in a side chain, at least one of the following structures capable of interacting with a surface of the support represented by formulas (a1-1), (a1-2), (a1-3), (a1-4) and (a1-5):

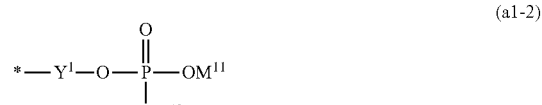

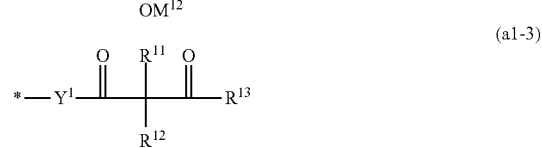

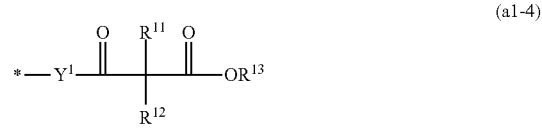

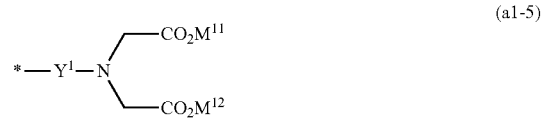

wherein in formulae (a1-1), (a1-2), (a1-3), (a1-4) and (a1-5), $M^{11}$ and $M^{12}$ each independently represents a hydrogen atom, a metal atom belonging to alkali metal or alkaline earth metal or an ammonium group, $R^{11}$ to $R^{13}$ each independently represents a hydrogen atom or an alkyl group, $Y^1$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

2. The lithographic printing plate precursor as claimed in claim 1, wherein the oxyalkylene group of the compound having a molecular weight of 1,500 or less and having an oxyalkylene group is a polyoxyethylene group or a polyoxypropylene group.

3. The lithographic printing plate precursor as claimed in claim 2, wherein the compound having a molecular weight of 1,500 or less and having a polyoxyethylene group or a polyoxypropylene group has an acid group or a salt thereof.

4. The lithographic printing plate precursor as claimed in claim 3, wherein the compound having a molecular weight of 1,500 or less and having a polyoxyethylene group or a polyoxypropylene group and an acid group or a salt thereof is a compound represented by the following formula (1A) or a compound having a structure represented by the following formula (1B2):

  (1A)

wherein, in the formula (1A), R represents a substituted or unsubstituted, alkyl group, alkenyl group, alkynyl group, aryl group or heterocyclic group, Z represents a polyoxyethylene group or a polyoxypropylene group, Y represents a substituted or unsubstituted alkylene group having 18 or less carbon atoms, a substituted or unsubstituted arylene group having 30 or less carbon atoms or a divalent heterocyclic group, and X represents an acid group or a salt thereof;

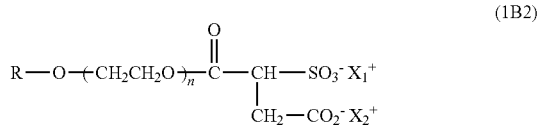  (1B2)

wherein, in the formula (1B2), R represents an alkyl group which may have a substituent or an aryl group which may have a substituent, n represents an integer from 0 to 20, and $X_1^+$ and $X_2^+$, which may be same or different, each represents $H^+$ or a monovalent cationic group, or one divalent cationic group may be present in place of $X_1^+$ and $X_2^+$.

5. The lithographic printing plate precursor as claimed in claim 3, wherein the acid group or a salt thereof is a sulfonic acid group or a salt thereof.

6. The lithographic printing plate precursor as claimed in claim 2, wherein an oxyethylene or oxypropylene repeating unit number n of the polyoxyethylene group or polyoxypropylene group in the compound having a molecular weight of 1,500 or less and having a polyoxyethylene group or a polyoxypropylene group is from 2 to 20.

7. The lithographic printing plate precursor as claimed in claim 6, wherein an oxyethylene or oxypropylene repeating unit number n of the polyoxyethylene group or polyoxypropylene group in the compound having a molecular weight of 1,500 or less and having a polyoxyethylene group or a polyoxypropylene group is from 2 to 15.

8. The lithographic printing plate precursor as claimed in claim 2, wherein the oxyalkylene group of the compound having a molecular weight of 1,500 or less and having an oxyalkylene group is a polyoxyethylene group.

9. The lithographic printing plate precursor as claimed in claim 1, wherein the polyoxyalkylene group of the polymer compound including a repeating unit (a1) having a support-adsorbing group and a repeating unit (a2) having a polyoxyalkylene group is a polyoxyethylene group or a polyoxypropylene group and a repeating unit number n is from 15 to 100.

10. The lithographic printing plate precursor as claimed in claim 1, wherein the polymer compound including a repeating unit (a1) having a support-adsorbing group and a repeating unit (a2) having a polyoxyalkylene group having a repeating number of oxyalkylene units from 8 to 120 includes a repeating unit (a3) having an ethylenically unsaturated bond in a side chain thereof.

11. The lithographic printing plate precursor as claimed in claim 1, wherein an overcoat layer is provided on the polymerizable image-recording layer.

12. The lithographic printing plate precursor as claimed in claim 1, wherein the polymerizable image-recording layer is capable of being removed with at least one of ink and dampening water.

13. A plate making method of a lithographic printing plate precursor comprising exposing imagewise the lithographic printing plate precursor as claimed in claim 12, mounting the exposed lithographic printing plate precursor on a printing machine and removing an unexposed area of the polymerizable image-recording layer with at least one of printing ink and dampening water.

* * * * *